United States Patent
Stokes et al.

(10) Patent No.: US 10,601,391 B2
(45) Date of Patent: Mar. 24, 2020

(54) FILM BULK ACOUSTIC RESONATOR WITH SPURIOUS RESONANCE SUPPRESSION

(71) Applicant: Global Communication Semiconductors, LLC, Torrance, CA (US)

(72) Inventors: Robert B. Stokes, Rancho Palos Verdes, CA (US); Alvin M. Kong, Manhattan Beach, CA (US); Liping Daniel Hou, Torrance, CA (US); Dae-Jin Hyun, Harbor City, CA (US); Shing-Kuo Wang, Torrance, CA (US)

(73) Assignee: GLOBAL COMMUNICATION SEMICONDUCTORS, LLC., Torrance, CA (US)

( * ) Notice: Subject to any disclaimer, the term of this patent is extended or adjusted under 35 U.S.C. 154(b) by 329 days.

(21) Appl. No.: 15/789,109

(22) Filed: Oct. 20, 2017

(65) Prior Publication Data
US 2018/0138885 A1  May 17, 2018

Related U.S. Application Data

(60) Provisional application No. 62/422,315, filed on Nov. 15, 2016.

(51) Int. Cl.
*H03H 9/02* (2006.01)
*H03H 9/13* (2006.01)
*H03H 3/02* (2006.01)

(52) U.S. Cl.
CPC ......... *H03H 9/02086* (2013.01); *H03H 3/02* (2013.01); *H03H 9/02047* (2013.01); *H03H 9/02062* (2013.01); *H03H 9/132* (2013.01)

(58) Field of Classification Search
CPC combination set(s) only.
See application file for complete search history.

(56) References Cited

U.S. PATENT DOCUMENTS

| | | | |
|---|---|---|---|
| 4,320,365 A | 3/1982 | Black et al. | |
| 5,578,974 A | 11/1996 | Yang et al. | |
| 5,587,620 A | 12/1996 | Ruby et al. | |
| 5,873,153 A | 2/1999 | Ruby et al. | |
| 5,894,647 A | 4/1999 | Lakin | |
| 6,060,818 A | 5/2000 | Ruby et al. | |

(Continued)

OTHER PUBLICATIONS

Yoo et al., Spurious Resonances and Modelling of Composite Resonators, Department of Physics, The Catholic University of America, Washington, D.C., © 1983 IEEE, 3 pgs.

(Continued)

*Primary Examiner* — Bryan P Gordon
(74) *Attorney, Agent, or Firm* — Morgan, Lewis & Bockius LLP

(57) ABSTRACT

Devices and processes for preparing devices are described for reducing resonance of spurious waves in a bulk acoustic resonator. A first electrode is coupled to a first side of a piezoelectric layer and a second electrode is coupled to a second side of the piezoelectric layer. The piezoelectric layer is configured to resonate in response to an electrical signal applied between the first electrode and the second electrode. Perforations in the first electrode, the piezoelectric layer and/or the second electrode, and/or posts or beams supporting the second electrode, reduce resonance of spurious waves.

23 Claims, 27 Drawing Sheets

(56) References Cited

U.S. PATENT DOCUMENTS

| | | | |
|---|---|---|---|
| 6,150,703 | A | 11/2000 | Cushman et al. |
| 6,262,637 | B1 | 7/2001 | Bradley et al. |
| 6,424,237 | B1 | 7/2002 | Ruby et al. |
| 6,693,500 | B2 | 2/2004 | Yang et al. |
| 6,828,713 | B2 | 12/2004 | Bradley et al. |
| 7,345,410 | B2 * | 3/2008 | Grannen .................. H03H 3/04 310/363 |
| 9,634,643 | B2 | 4/2017 | Shin et al. |
| 9,842,980 | B2 | 12/2017 | Park et al. |
| 2010/0148637 | A1 * | 6/2010 | Satou ....................... H03H 3/02 310/367 |
| 2011/0080233 | A1 | 4/2011 | Petit et al. |
| 2011/0298564 | A1 * | 12/2011 | Iwashita .................. H03H 3/02 333/187 |
| 2013/0057115 | A1 * | 3/2013 | Saito ........................ H03H 3/02 310/366 |
| 2016/0294354 | A1 * | 10/2016 | Saijo .................... H03H 9/1071 |

OTHER PUBLICATIONS

Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.
Working principles and Applications of SAW/FBAR Devices, Taiyo Yuden Navigator, downloaded Oct. 2017, 6 pgs.

\* cited by examiner

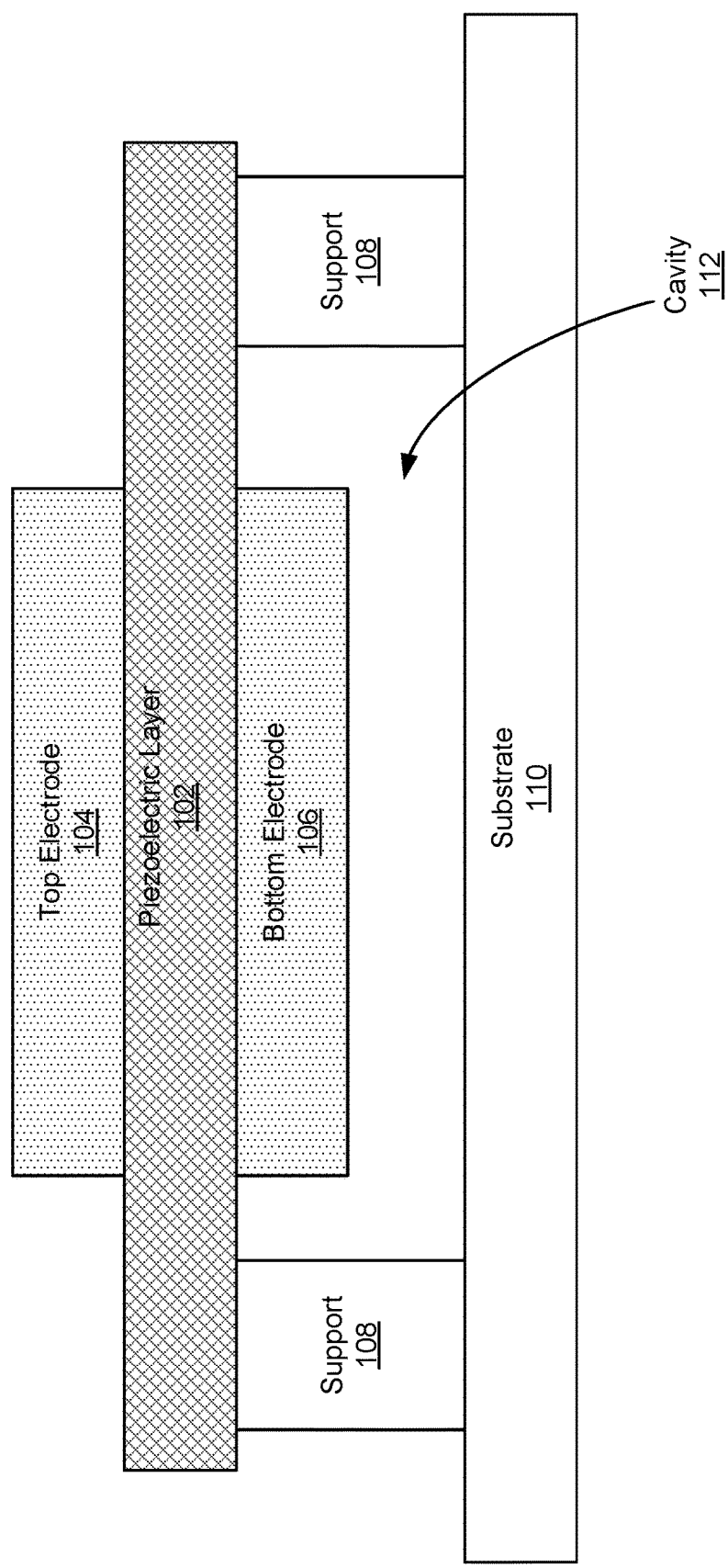

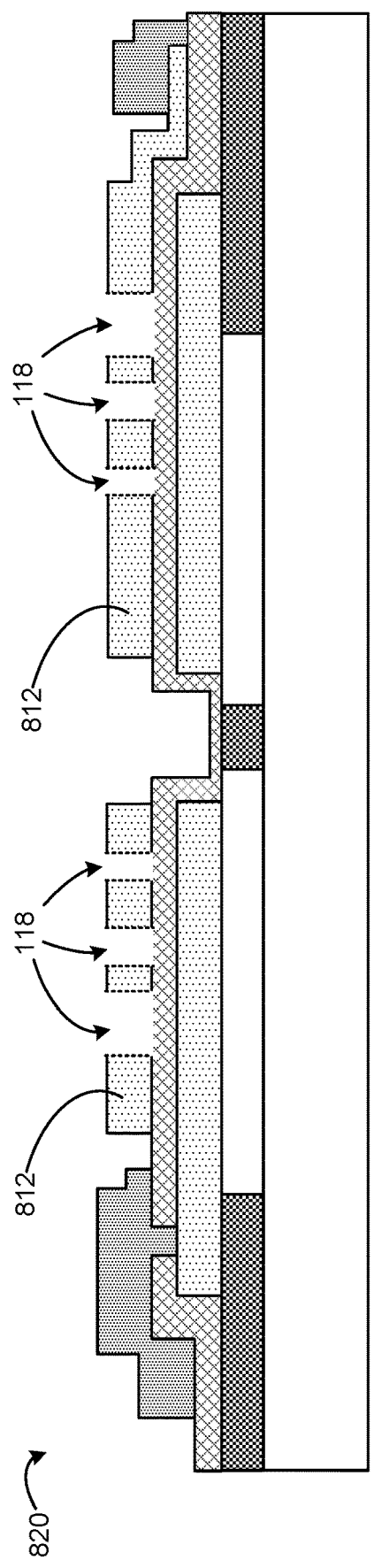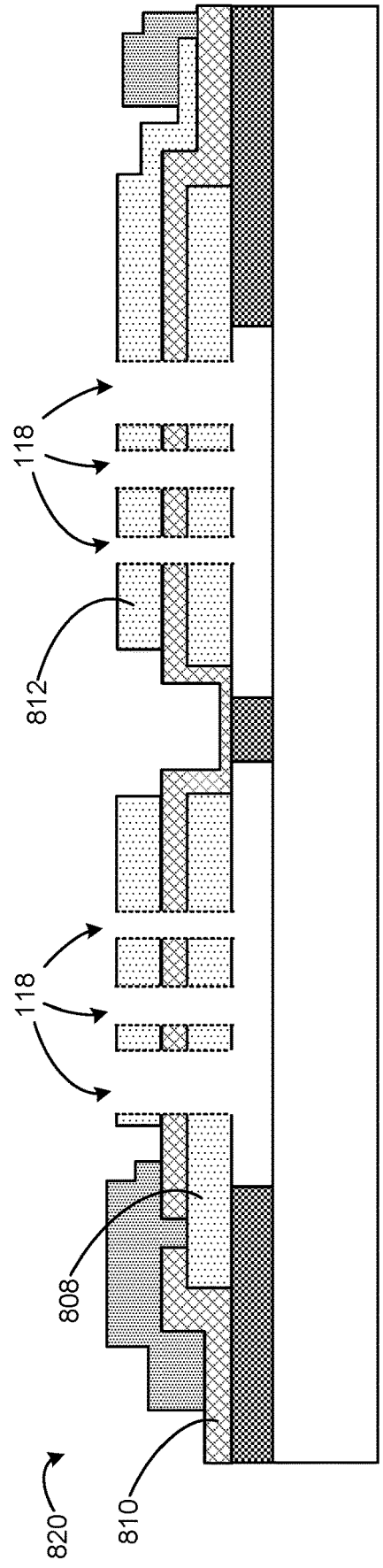
Figure 9A
Figure 9B

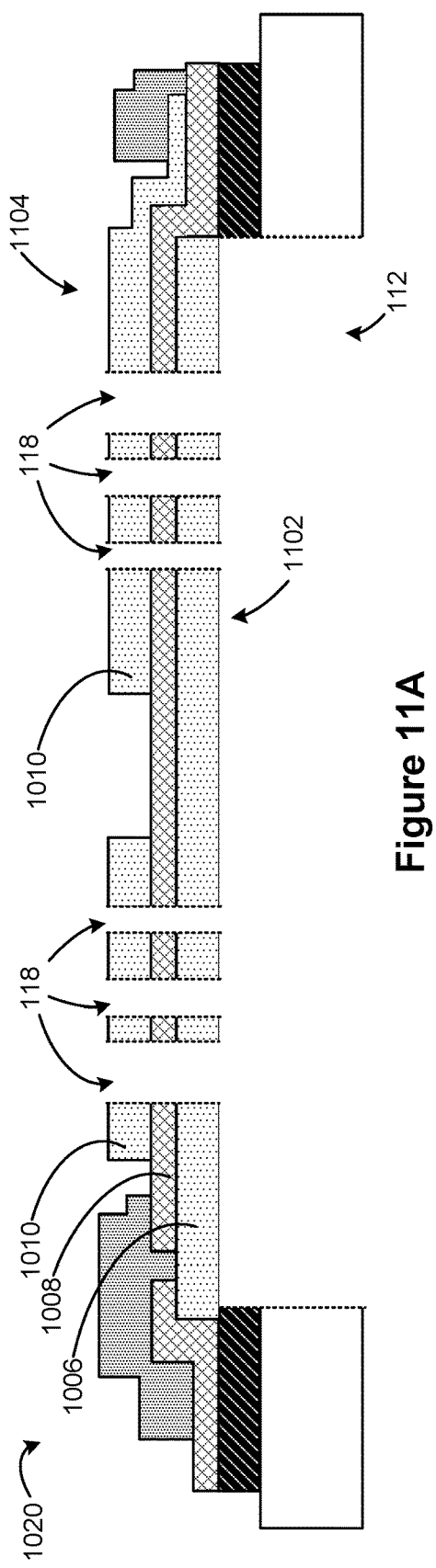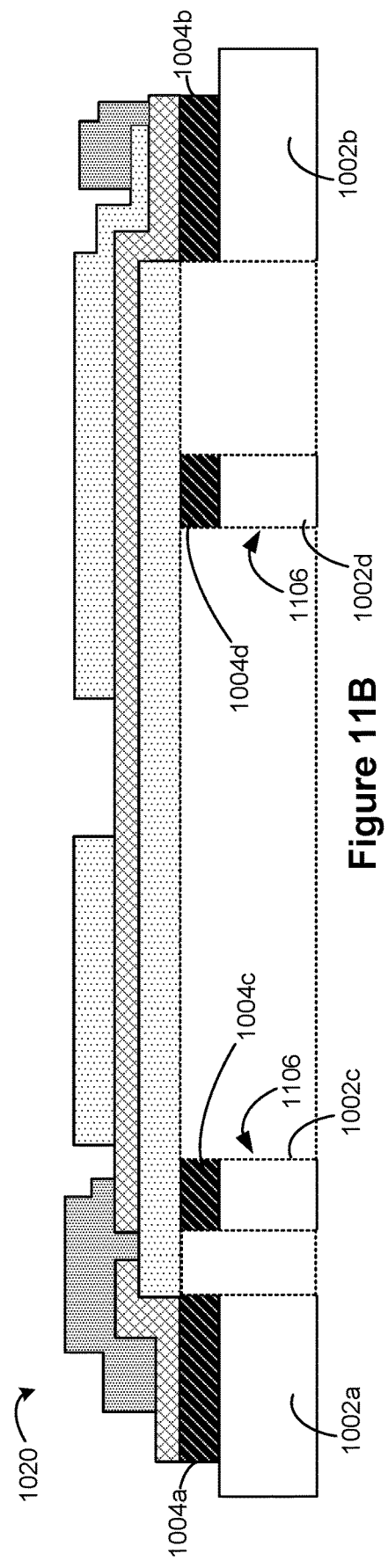
Figure 11A
Figure 11B

FILM BULK ACOUSTIC RESONATOR WITH SPURIOUS RESONANCE SUPPRESSION

RELATED APPLICATIONS

This application claims priority to U.S. Provisional Patent Application 62/422,315, filed Nov. 15, 2016, which is hereby incorporated by reference in its entirety.

TECHNICAL FIELD

The disclosed embodiments relate generally to bulk acoustic resonators, and in particular, to film bulk acoustic resonators with structures for reducing resonance of spurious waves.

BACKGROUND

A film bulk acoustic resonator (FBAR) includes a stack of a bottom electrode, a piezoelectric thin film layer, and a top electrode. (The bottom electrode, the piezoelectric thin film layer, and the top electrode are collectively referred to herein as the "stack" and the "FBAR stack.") When an electrical signal is applied to the top and bottom electrodes, the piezoelectric thin film layer converts the electrical energy of the signal into mechanical energy. An oscillating electrical signal applied to the piezoelectric thin film layer causes pressure and/or shear waves to propagate through the bulk of the FBAR stack. The waves in the stack are referred to as bulk acoustic waves. The bulk acoustic waves have their primary resonance in the stack at frequencies that are determinable from the thicknesses of the piezoelectric film and electrode layers.

The performance of a band-pass filter is improved by a structure that resonates at a desired frequency (e.g., the fundamental frequency) and impedes spurious resonances, such as unwanted minor resonances at frequencies other than (e.g., nearby) the fundamental frequency. Typically, FBARs operate primarily with longitudinal bulk acoustic waves, which propagate perpendicular to the plane of the piezoelectric thin film layer. The bulk waves reflect from the free surfaces at the top and the bottom of the stack, yielding sharply defined fundamental resonant frequencies, which is useful for constructing band-pass filters. The structure of an FBAR tends to result in a series of minor resonances with frequencies close to the fundamental resonant frequency, causing unwanted ripples (e.g., ripples that can be seen in an FBAR impedance over frequency graph). For example, the spurious resonances are caused by, e.g., standing lateral waves (plate waves) as a result of reflections from the edges (e.g., sides) of the FBAR stack and/or reflections from the edges of the cavity below the FBAR stack, resulting in ripples near the main resonant frequencies. These impedance ripples can affect the filter performance (e.g., loss over frequency) of an FBAR. Suppression of spurious resonances that cause impedance ripples, using the techniques described herein, can improve the filter performance of an FBAR.

SUMMARY

Without limiting the scope of the appended claims, after considering this disclosure, and particularly after considering the section entitled "Detailed Description," one will understand how the aspects of various embodiments are used to suppress resonance of spurious waves in an FBAR. For example, the arrangement of perforations, posts, and/or beams suppress resonance of spurious waves, e.g., by reflecting lateral waves in the FBAR.

In some embodiments, a bulk acoustic resonator includes a stack that includes a first electrode coupled to a first side of a piezoelectric layer and a second electrode coupled to a second side of the piezoelectric layer. The stack is configured to resonate in response to an electrical signal applied between the first electrode and the second electrode. The second electrode is perforated by a first plurality of perforations that reduce resonance of spurious waves.

In some embodiments, a bulk acoustic resonator includes a stack that includes a first electrode coupled to a first side of a piezoelectric layer and a second electrode coupled to a second side of the piezoelectric layer. The stack is configured to resonate in response to an electrical signal applied between the first electrode and the second electrode. A cavity below the first electrode includes a plurality of posts that are coupled to the first electrode. The plurality of posts reduces resonance of spurious waves.

In some embodiments, a bulk acoustic resonator is prepared by a process comprising the steps of: forming a layer of sacrificial material; forming, over the layer of sacrificial material, a first electrode; forming, over the first electrode, a piezoelectric film element; forming, over the piezoelectric film element, a second electrode, wherein the second electrode includes a plurality of perforations to reduce resonance of spurious waves in the produced bulk acoustic resonator; and removing at least a portion of the sacrificial material to form a cavity below the first electrode.

In some embodiments, a bulk acoustic resonator is prepared by a process comprising the steps of: forming a layer of sacrificial material; removing a first portion of the sacrificial material; forming post material at a location that corresponds to the removed first portion of the sacrificial material; forming, over the layer of sacrificial material, a deposit of material for a first electrode; forming, over the first electrode, a piezoelectric film element; forming, over the piezoelectric film element, a second electrode; and forming a plurality of posts below the first electrode by removing a second portion of the sacrificial material to form a cavity below the first electrode, wherein the cavity surrounds the post.

In some embodiments, a bulk acoustic resonator is prepared by a process comprising the steps of: forming, on a substrate, a layer of support material; forming, over the layer of support material, a first electrode; forming, over the first electrode, a piezoelectric film element; forming, over the piezoelectric film element, a second electrode, wherein the second electrode includes a plurality of perforations to reduce resonance of spurious waves in the produced bulk acoustic resonator; removing at least a portion of the substrate; and removing at least a portion of the layer of the support material.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 1 is a cross-sectional diagram of a bulk acoustic resonator, in accordance with some embodiments.

FIGS. 9A-9B illustrate perforations in a bulk acoustic resonator formed as described with regard to FIGS. 8A-8I.

FIG. 11A illustrates formation of perforations in a bulk acoustic resonator formed by backside etching, in accordance with some embodiments.

FIG. 11B illustrates formation of beams in a bulk acoustic resonator formed by backside etching, in accordance with some embodiments.

Figure 2A:
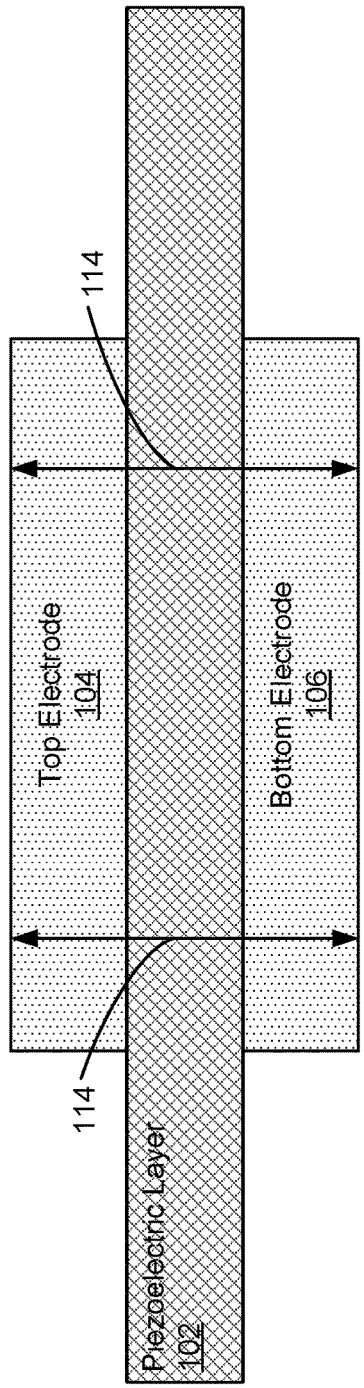
FIG. 2A is a cross sectional view that illustrates vertical waves of acoustic resonance in an FBAR stack, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to reduce resonance of spurious waves.

(A1) More specifically, some embodiments include a bulk acoustic resonator that includes a stack that includes a first electrode coupled to a first side of a piezoelectric layer; and a second electrode coupled to a second side of the piezoelectric layer; wherein the stack is configured to resonate in response to an electrical signal applied between the first electrode and the second electrode; and wherein the second electrode is perforated by a first plurality of perforations that reduce resonance of spurious waves.

(A2) In some embodiments of the bulk acoustic resonator of any of A1-A2, a distribution of a set of perforations in the first plurality of perforations satisfies predefined non-uniformity and/or randomness criteria.

(A3) In some embodiments of the bulk acoustic resonator of any of A1-A3, a first subset of the first plurality of perforations is asymmetric with respect to a second subset of the first plurality of perforations.

(A4) In some embodiments of the bulk acoustic resonator of any of A1-A3, a first subset of the first plurality of perforations has a first density and a second subset of the first plurality of perforations has a second density that is different from the first density.

(A5) In some embodiments of the bulk acoustic resonator of any of A1-A4, a first subset of the first plurality of perforations has a first distance from a first edge of the second electrode and a second subset of the first plurality of perforations has a second distance from the first edge of the second electrode that is different from the first distance.

(A6) In some embodiments of the bulk acoustic resonator of any of A1-A5, the first electrode and/or the second electrode has at least one irregularly indented edge.

(A7) In some embodiments of the bulk acoustic resonator of any of A1-A6, the piezoelectric layer is perforated by a second plurality of perforations, and the first electrode is perforated by a third plurality of perforations.

(A8) In some embodiments of the bulk acoustic resonator of A7, the first plurality of perforations have a first distribution of perforations, and the second plurality of perforations and/or the third plurality of perforations have a second distribution of perforations that is distinct from the first distribution of perforations.

(A9) In some embodiments of the bulk acoustic resonator of A7, the first plurality of perforations have a first distribution of perforations, and at least a subset of the second plurality of perforations and/or at least a subset of the third plurality of perforations have a second distribution of perforations that is aligned with at least a subset of the first distribution of perforations.

(A10) Some embodiments include a bulk acoustic resonator that includes a stack that includes a first electrode coupled to a first side of a piezoelectric layer and a second electrode coupled to a second side of the piezoelectric layer; wherein the stack is configured to resonate in response to an electrical signal applied between the first electrode and the second electrode; and wherein a cavity below the first electrode includes a plurality of posts that are coupled to the first electrode, wherein the plurality of posts reduce resonance of spurious waves.

(A11) In some embodiments of the bulk acoustic resonator of A10, a first post of the plurality of posts has a first footprint and a second post of the plurality of posts has a second footprint that is distinct from the first footprint.

(A12) In some embodiments of the bulk acoustic resonator of any of A10-A11, a distribution of a set of posts in the plurality of posts satisfies predefined non-uniformity and/or randomness criteria.

(A13) In some embodiments of the bulk acoustic resonator of any of A10-A12, a first subset of the plurality of posts is asymmetric with respect to a second subset of the plurality of posts.

(A14) In some embodiments of the bulk acoustic resonator of any of A10-A13, the first electrode and/or the second electrode has at least one irregularly indented edge.

(A15) In some embodiments of the bulk acoustic resonator of any of A10-A14, the second electrode is perforated by a first plurality of perforations that reduce resonance of spurious waves.

(A16) In some embodiments of the bulk acoustic resonator of A15, distribution of the plurality of posts is distinct from a distribution of the first plurality of perforations.

(A17) In some embodiments of the bulk acoustic resonator of A15, the piezoelectric layer is perforated by a second plurality of perforations, and the second electrode is perforated by a third plurality of perforations.

(A18) Some embodiments include a bulk acoustic resonator prepared by a process comprising the steps of: forming a layer of sacrificial material, forming, over the layer of sacrificial material, a first electrode; forming, over the first electrode, a piezoelectric film element, forming, over the piezoelectric film element, a second electrode, wherein the second electrode includes a plurality of perforations to reduce resonance of spurious waves in the produced bulk acoustic resonator; and removing at least a portion of the sacrificial material to form a cavity below the first electrode.

(A19) In some embodiments of the bulk acoustic resonator of claim A18, the process includes forming a plurality of perforations in the piezoelectric film element.

(A20) In some embodiments of the bulk acoustic resonator of A18-A19, the process includes forming a plurality of perforations in the first electrode.

(A21) In some embodiments of the bulk acoustic resonator of A18-A20, the process includes, prior to forming the first electrode: removing a first portion of the sacrificial material; and forming post material at a location that corresponds to the removed first portion of the sacrificial material; and forming a plurality of posts includes the removing the sacrificial material to form the cavity below the first electrode, wherein the cavity surrounds the post.

(A22) In some embodiments of the bulk acoustic resonator of A18-A21, the process includes forming at least one perforation that perforates the first electrode, the piezoelectric film element, and the second electrode; and removing the at least a portion of the sacrificial material to form the cavity below the first electrode includes removing the sacrificial material by way of the at least one perforation.

(A23) In some embodiments of the bulk acoustic resonator of A22, removing the at least a portion of the sacrificial material to form the cavity below the first electrode includes depositing an etchant for etching the sacrificial material into the at least one perforation and, after etching the sacrificial material, removing the etchant and etch products by way of the at least one perforation.

(A24) Some embodiments include a bulk acoustic resonator prepared by a process comprising the steps of forming a layer of sacrificial material; removing a first portion of the sacrificial material; forming post material at a location that corresponds to the removed first portion of the sacrificial material; forming, over the layer of sacrificial material, a deposit of material for a first electrode; forming, over the first electrode, a piezoelectric film element, forming, over the piezoelectric film element, a second electrode; and forming a plurality of posts below the first electrode by removing a second portion of the sacrificial material to form a cavity below the first electrode, wherein the cavity surrounds the post.

(A25) In some embodiments of the bulk acoustic resonator prepared by the process of A24, the process includes forming a plurality of perforations in at least one of the first electrode, the piezoelectric film element, and the second electrode.

(A26) Some embodiments include a bulk acoustic resonator prepared by a process comprising the steps of: forming, on a substrate, a layer of support material; forming, over the layer of support material, a first electrode; forming, over the first electrode, a piezoelectric film element; forming, over the piezoelectric film element, a second electrode, wherein the second electrode includes a plurality of perforations to reduce resonance of spurious waves in the produced bulk acoustic resonator; removing at least a portion of the substrate; and removing at least a portion of the layer of the support material.

(A27) In some embodiments of the bulk acoustic resonator prepared by the process of A26, a remaining portion of the substrate and a remaining portion of the layer of the support material form one or more support beams, wherein a length of a respective support beam spans at least half of a distance across a cavity formed by the removed portion of the substrate and the removed portion of the layer of the support material.

(A28) In some embodiments of the bulk acoustic resonator prepared by the process of A26-A27, the process includes forming a plurality of perforations in at least one of the first electrode or the piezoelectric film element.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross-sectional diagram of a bulk acoustic resonator 100, in accordance with some embodiments. Bulk acoustic resonator 100 includes a stack of a top electrode 104 coupled to a first side of a piezoelectric layer 102 and a bottom electrode 106 coupled to a second side of piezoelectric layer 102. In some embodiments, piezoelectric layer 102 has a thickness of 1-2 micrometers. In some embodiments, the electrode dimensions in the plane of the electrode are 200-1000 micrometers. The stack resonates in response to an electrical signal applied between the top electrode 104 and the bottom electrode 106. In some embodiments, one or more of piezoelectric layer 102, top electrode 104, and/or bottom electrode 106 are supported with respect to a substrate 110 by one or more support members 108. In some embodiments, support members 108 support one or more of piezoelectric layer 102, top electrode 104, and/or bottom electrode 106 suspended above substrate 110 (e.g., forming a cavity 112). Cavity 112 provides a space between the substrate 110 and the piezoelectric layer 102 in which the FBAR stack is free to resonate in response to electrical signals provided between top electrode 104 and bottom electrode 106.

In some embodiments, top electrode 104, piezoelectric layer 102, and/or bottom electrode 106 include a plurality of perforations to reduce resonance of spurious waves. In some embodiments, one or more posts in cavity 112 support bottom electrode 106 (e.g., to reduce resonance of spurious waves and/or to improve the strength of the bulk acoustic resonator structure). When bulk acoustic resonator 100 is used as a part of a band-pass filter, vertical waves of acoustic resonance are typically desirable and lateral waves of acoustic resonance are typically undesirable.

FIG. 2A is a cross sectional view that illustrates vertical waves of acoustic resonance in an FBAR stack including piezoelectric layer 102, top electrode 104, and bottom electrode 106, in accordance with some embodiments. The vertical waves of acoustic resonance are illustrated by arrows 114.

Figure 2B:
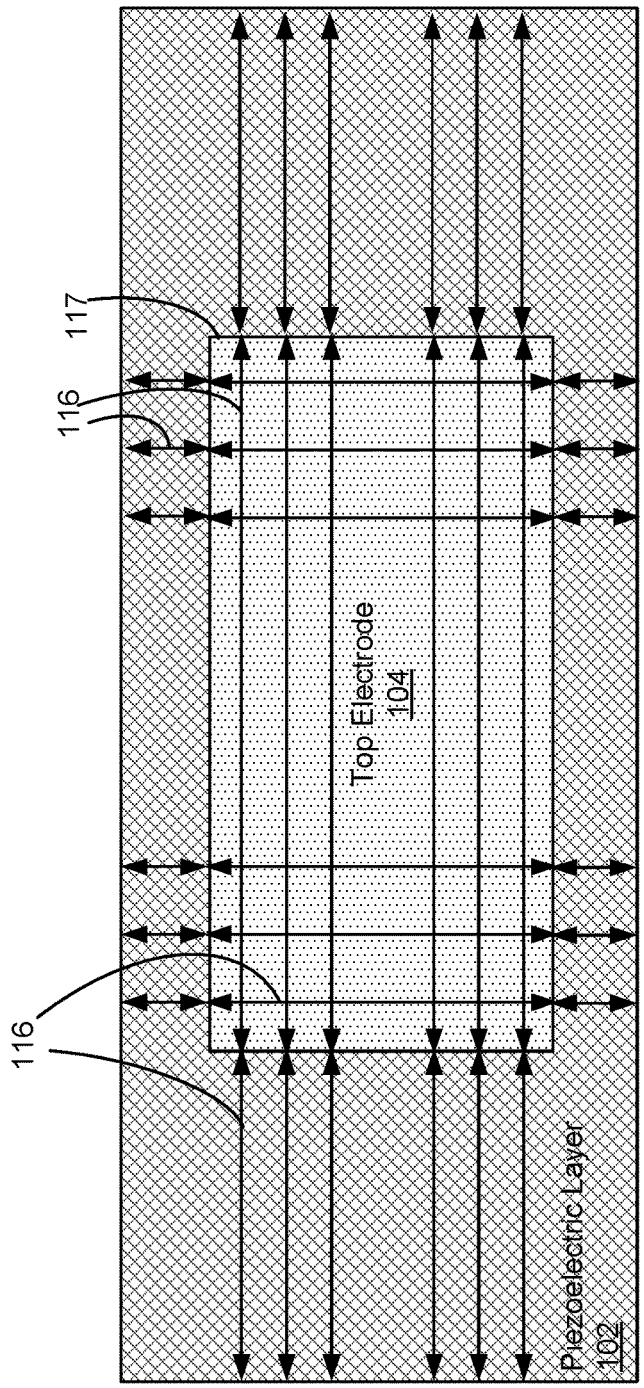
FIG. 2B is a top-down view that illustrates lateral waves of acoustic resonance in an FBAR stack, in accordance with some embodiments.

FIG. 2B is a top-down view that illustrates lateral waves of acoustic resonance in the stack (e.g., resonance of waves traveling predominantly laterally across the stack, as indicated by arrows 116), in accordance with some embodiments.

Figure 6:
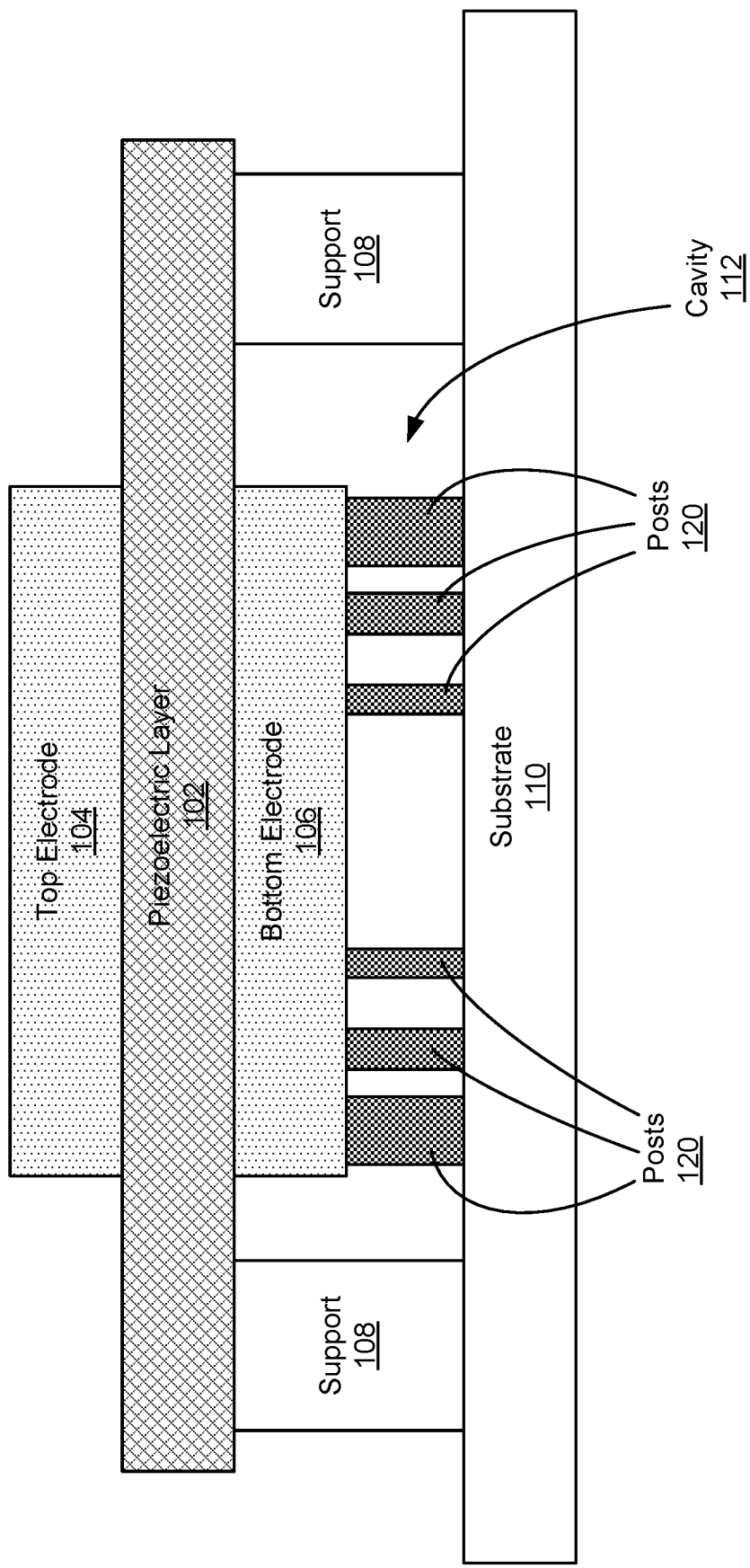
FIG. 6 is a cross-sectional diagram of a bulk acoustic resonator that includes a plurality of posts, in accordance with some embodiments.
Figure 7:
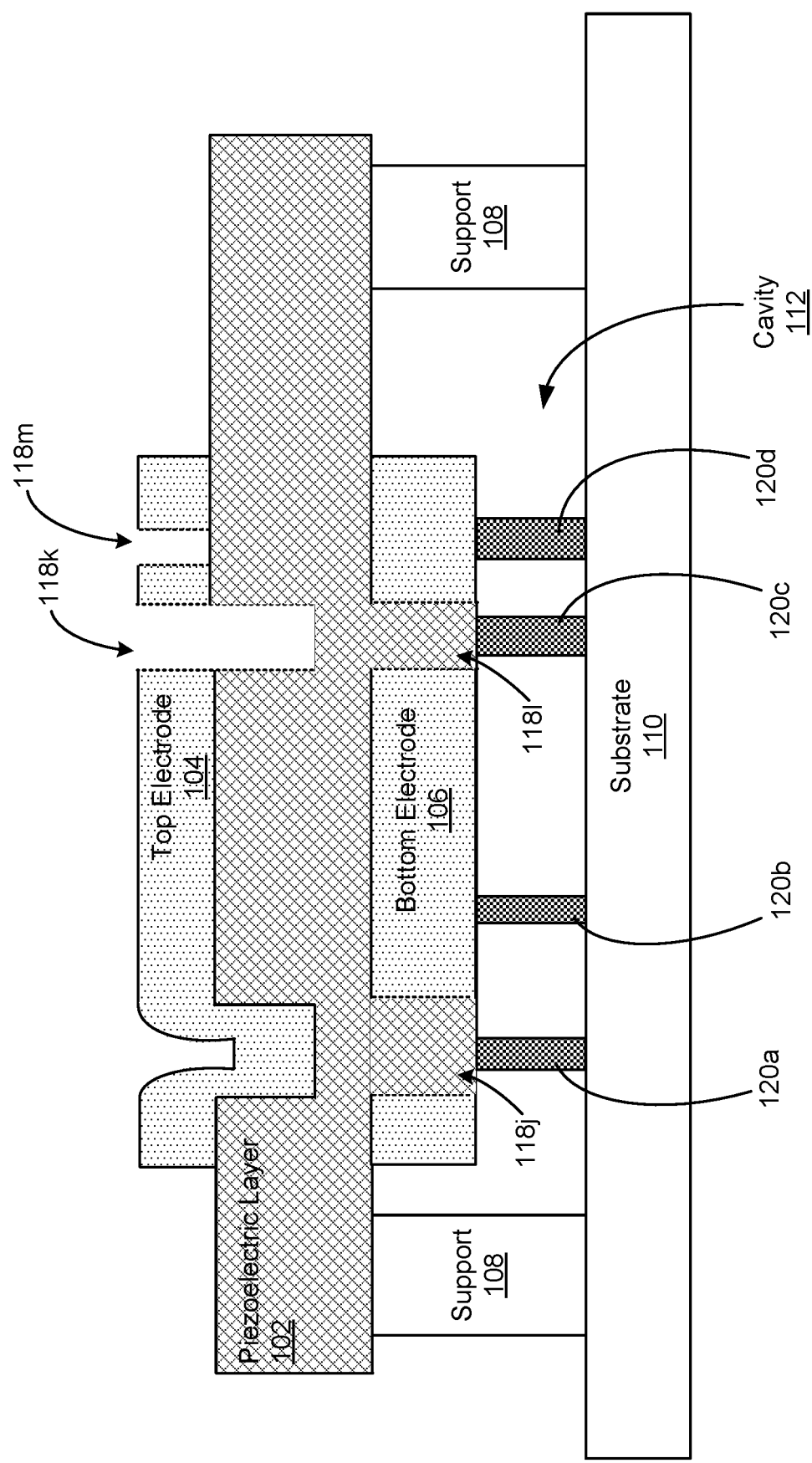
FIG. 7 is a cross-sectional diagram of a bulk acoustic that includes a plurality of posts and a plurality of perforations, in accordance with some embodiments.
Figure 11C:
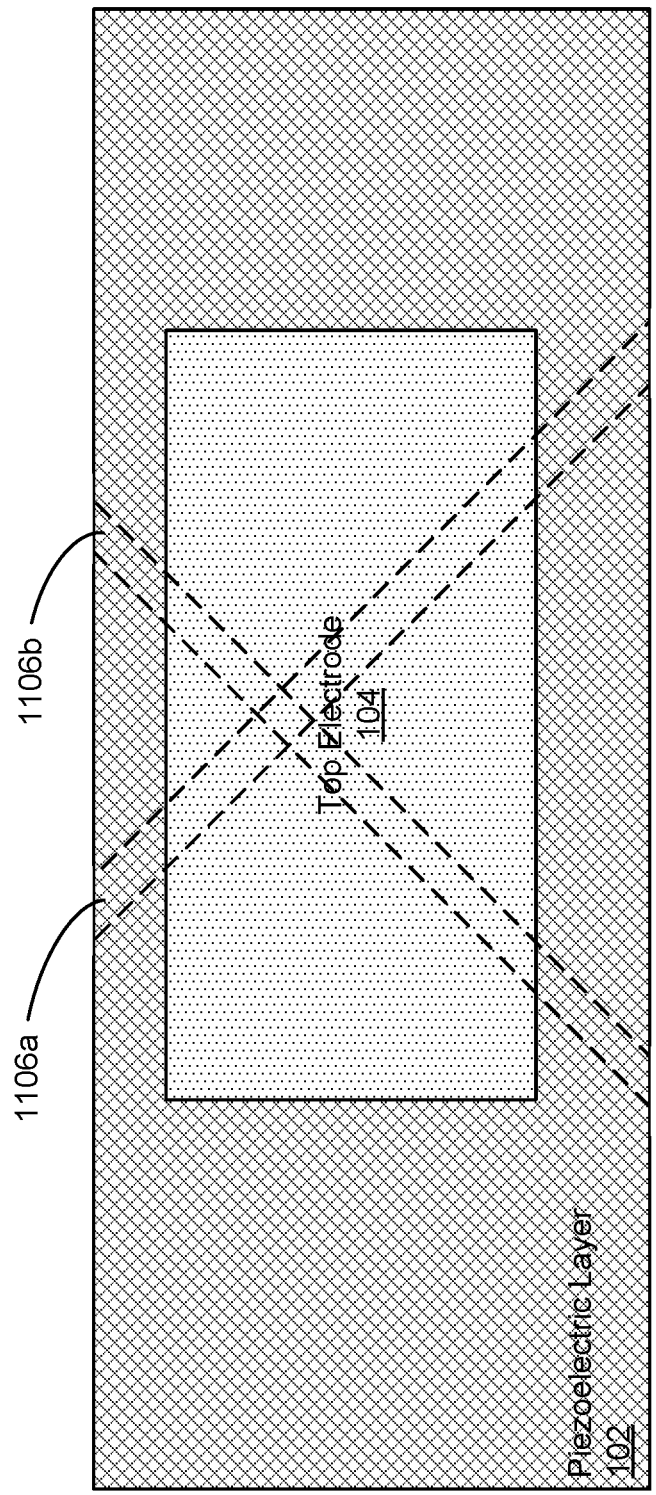
FIG. 11C illustrates a top down view of beams that support a stack of a bulk acoustic resonator, in accordance with some embodiments.
Figure 12:
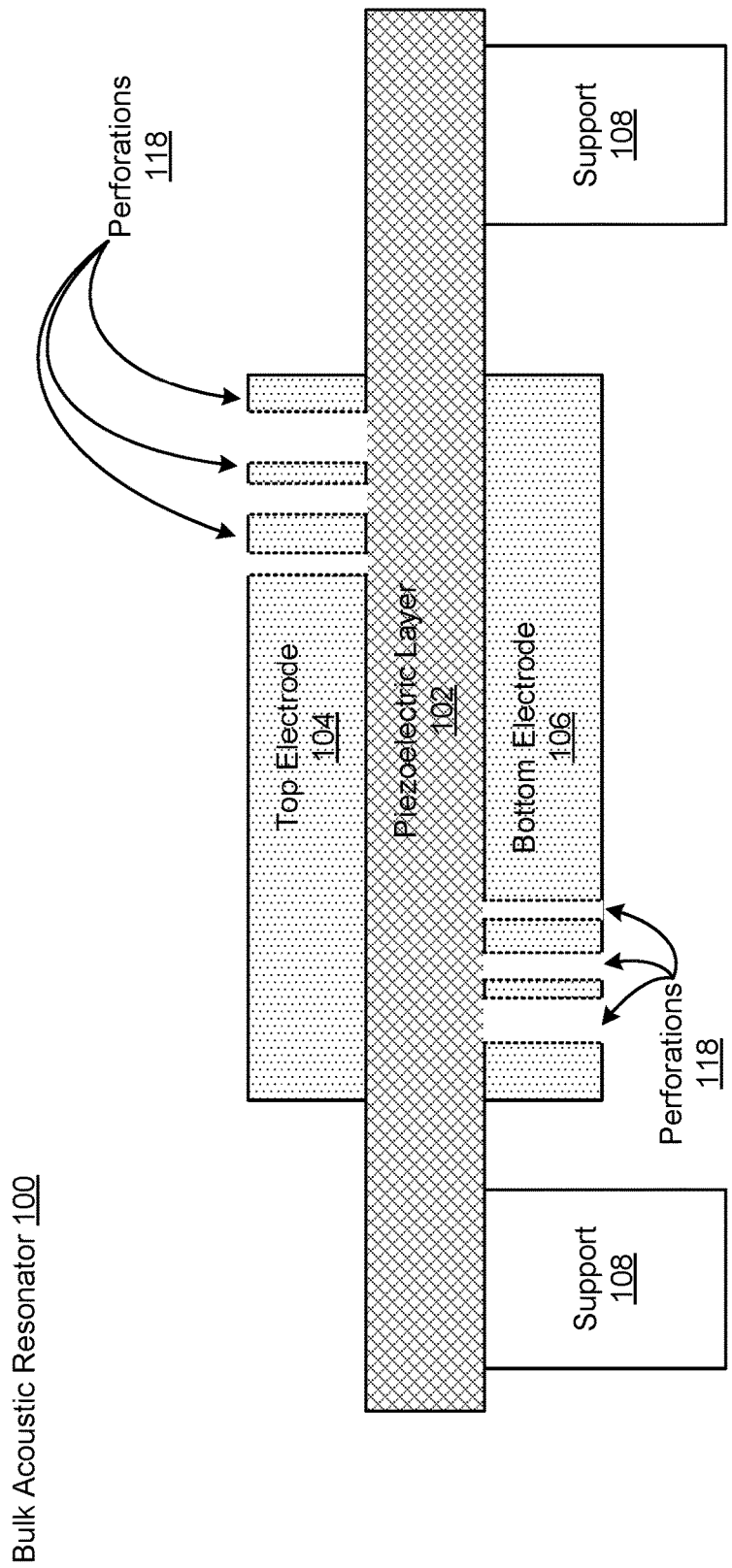
FIGS. 12-14 illustrate exemplary perforation configurations in a bulk acoustic resonator formed by a backside etching approach, in accordance with some embodiments.
Figure 13:
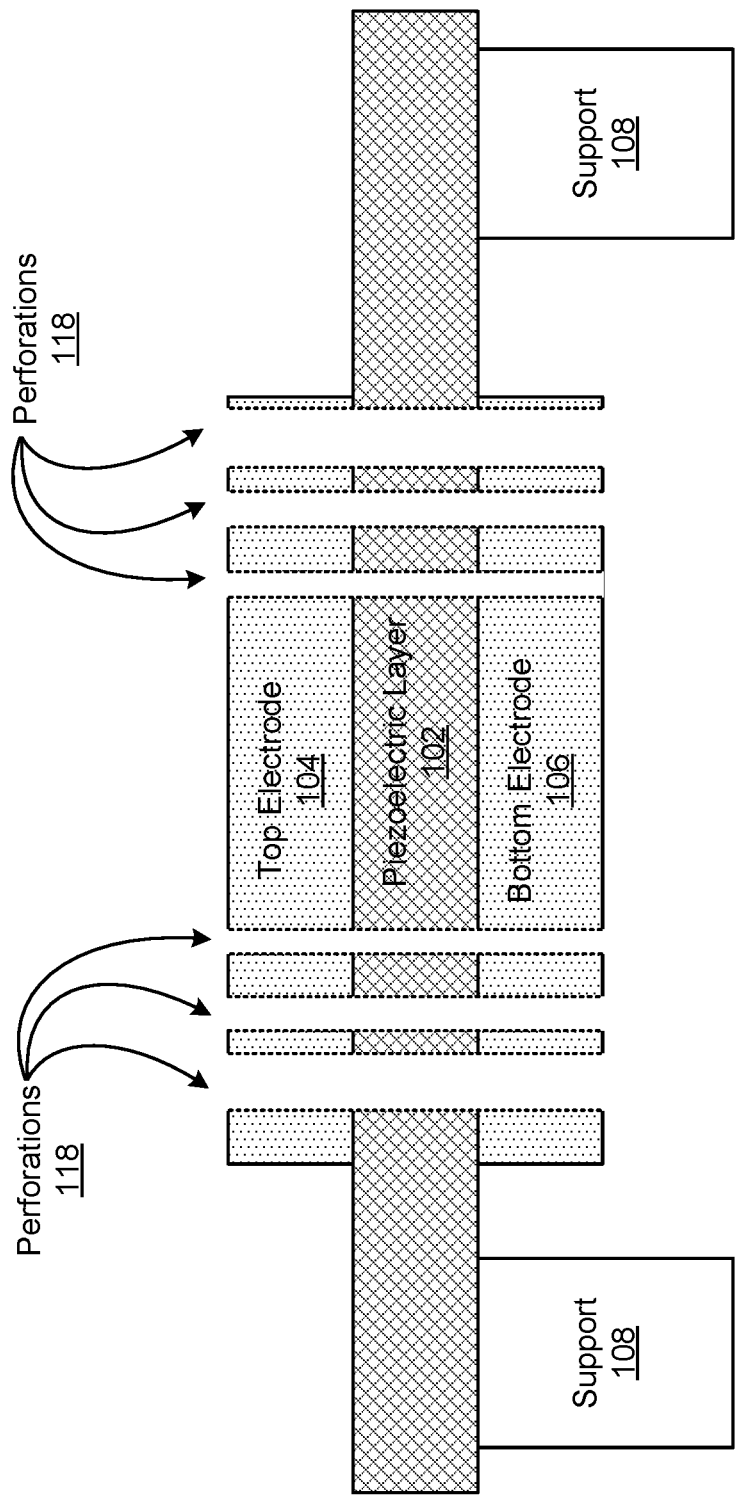
Figure 14:
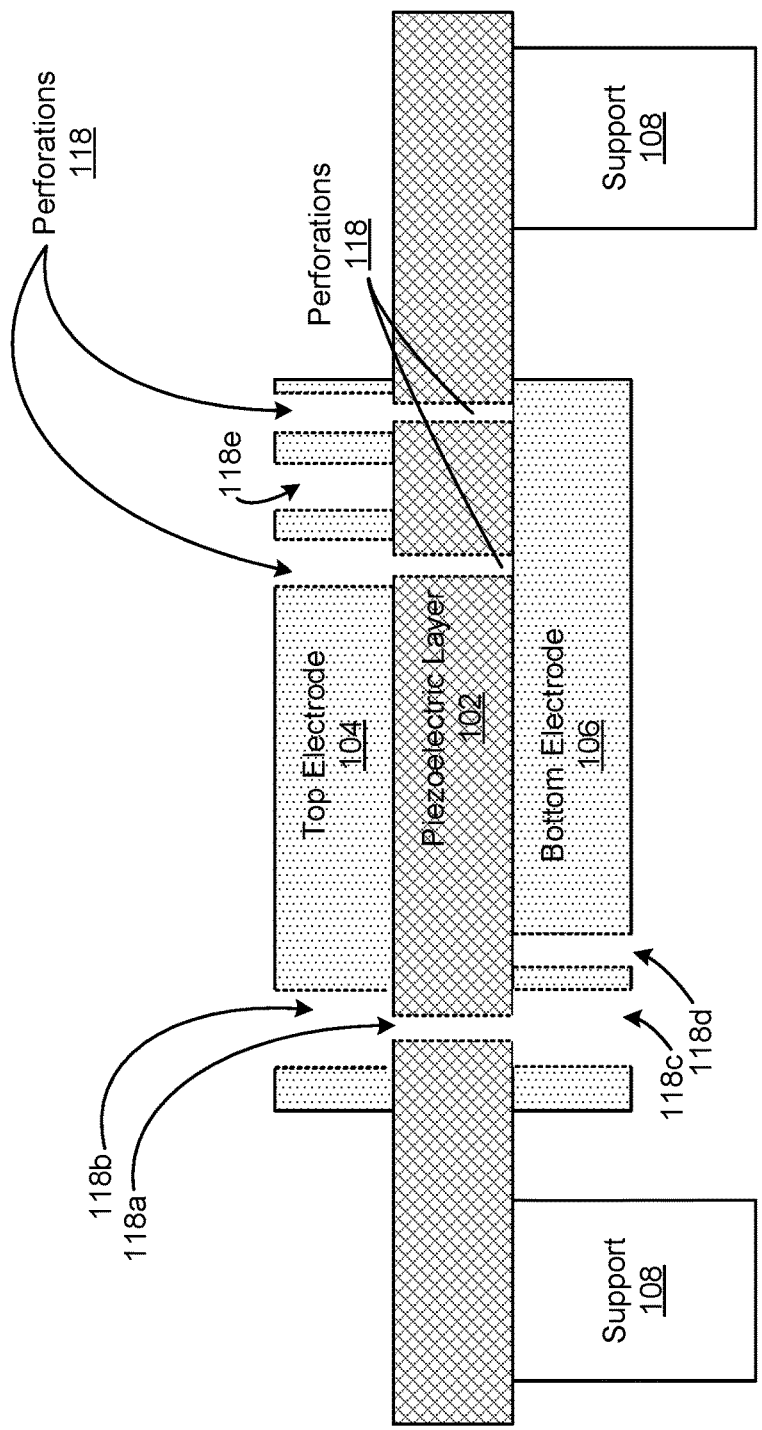

In some embodiments, various arrangements of perforations and/or posts are used to create irregular acoustic boundary conditions that interfere with formation of resonance of lateral waves. In this way, resonance of spurious waves (e.g., lateral waves) is reduced. Below, FIGS. 3-5 and 7 illustrate various configurations of perforations in bulk acoustic resonator 102 (e.g., fabricated as described with regard to FIGS. 8A-8I and/or FIG. 9A-9B) and FIGS. 12-14 illustrate various configurations of perforations in bulk acoustic resonator 100 (e.g., fabricated as described with regard to FIGS. 10A-10F and/or FIGS. 11A-11C). FIGS. 6-7 illustrate various configurations of posts for bulk acoustic resonator 102 (e.g., fabricated as described with regard to FIGS. 8A-8I). FIGS. 11B-11C illustrate beams that support bulk acoustic resonator 102 (e.g., fabricated as described with regard to FIGS. 10A-10F). FIGS. 15-19 illustrate various patterns for perforations and/or posts in top electrode 104, piezoelectric layer 102, and/or bottom electrode 106.

Figure 3:
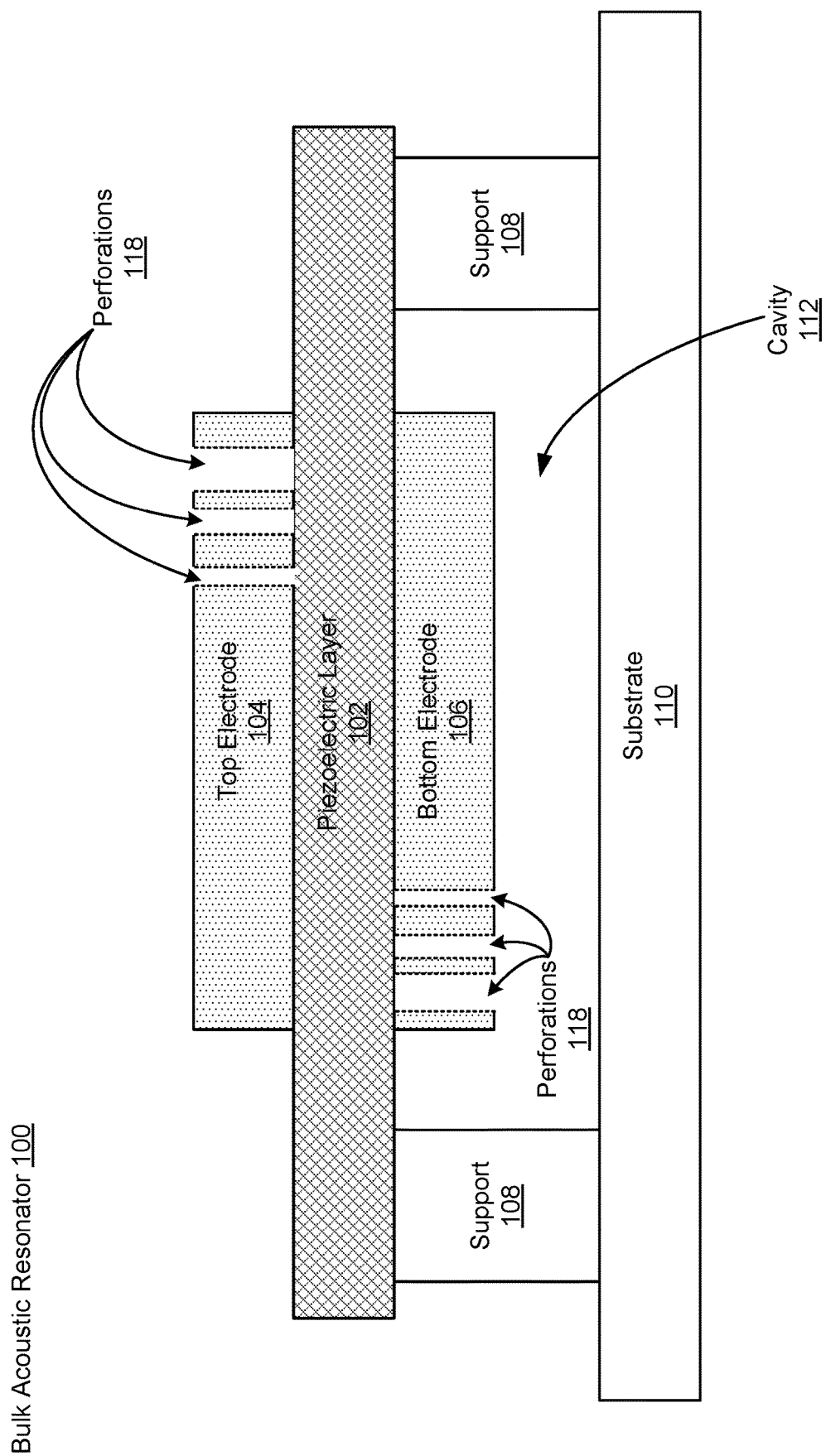
FIG. 3 is a cross-sectional diagram of a bulk acoustic resonator that includes a plurality of perforations in a top electrode and a plurality of perforations in a bottom electrode, in accordance with some embodiments.

FIG. 3 is an illustrative cross-sectional diagram of a bulk acoustic resonator 100 that includes a plurality of perforations 118 in top electrode 104 and a plurality of perforations 118 in bottom electrode 106, in accordance with some embodiments.

Figure 4:
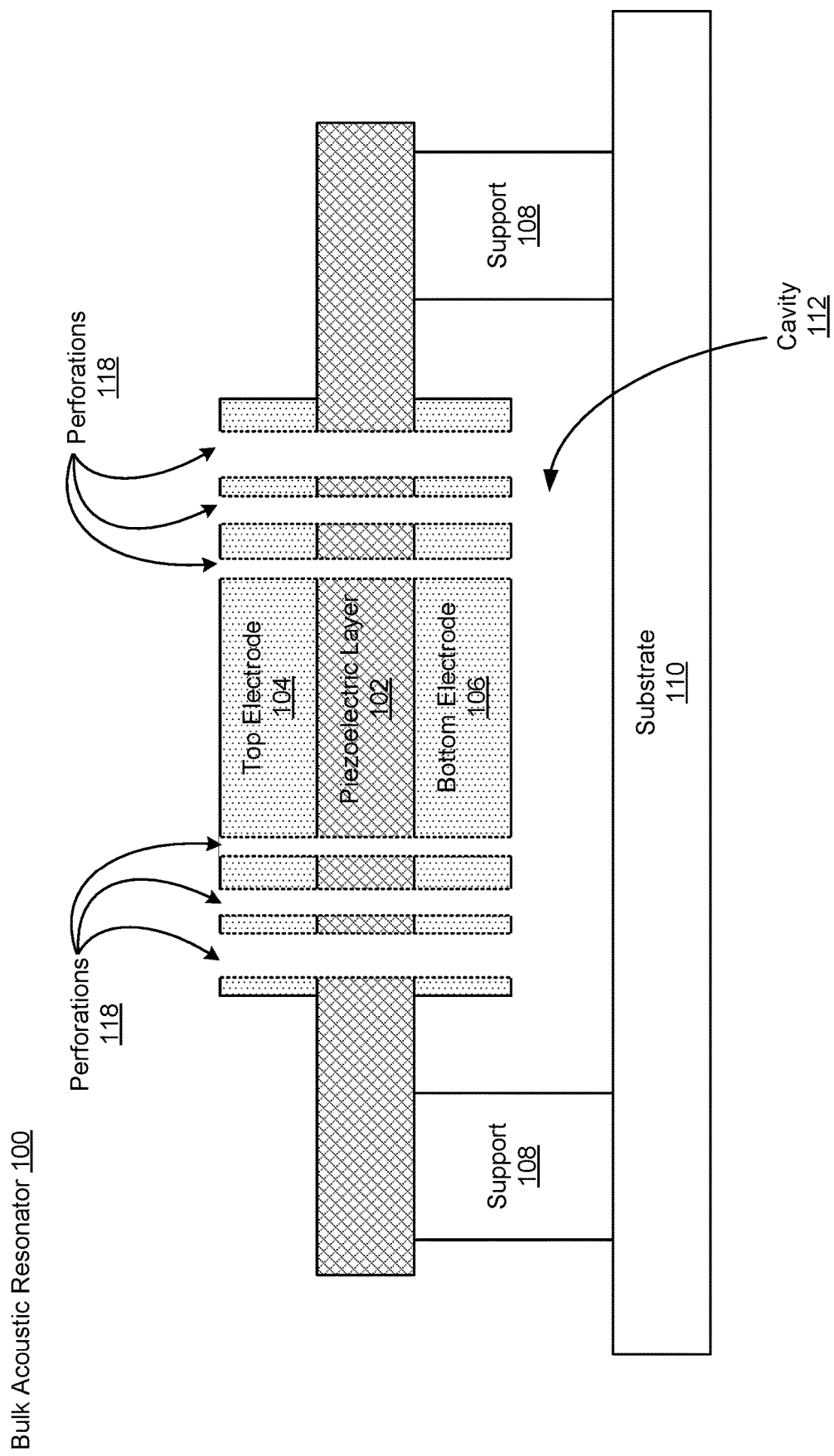
FIGS. 4-5 are cross-sectional diagrams of a bulk acoustic resonator that includes a plurality of perforations that pass through a top electrode, a piezoelectric layer, and a bottom electrode, in accordance with some embodiments.

FIG. 4 is an illustrative cross-sectional diagram of a bulk acoustic resonator 100 that includes a plurality of perforations 118 that pass through top electrode 104, piezoelectric layer 102, and bottom electrode 106, in accordance with some embodiments. The perforations 118 in piezoelectric layer 102 align with the perforations 118 in top electrode 104 and with the perforations 118 in bottom electrode 106.

Figure 5:
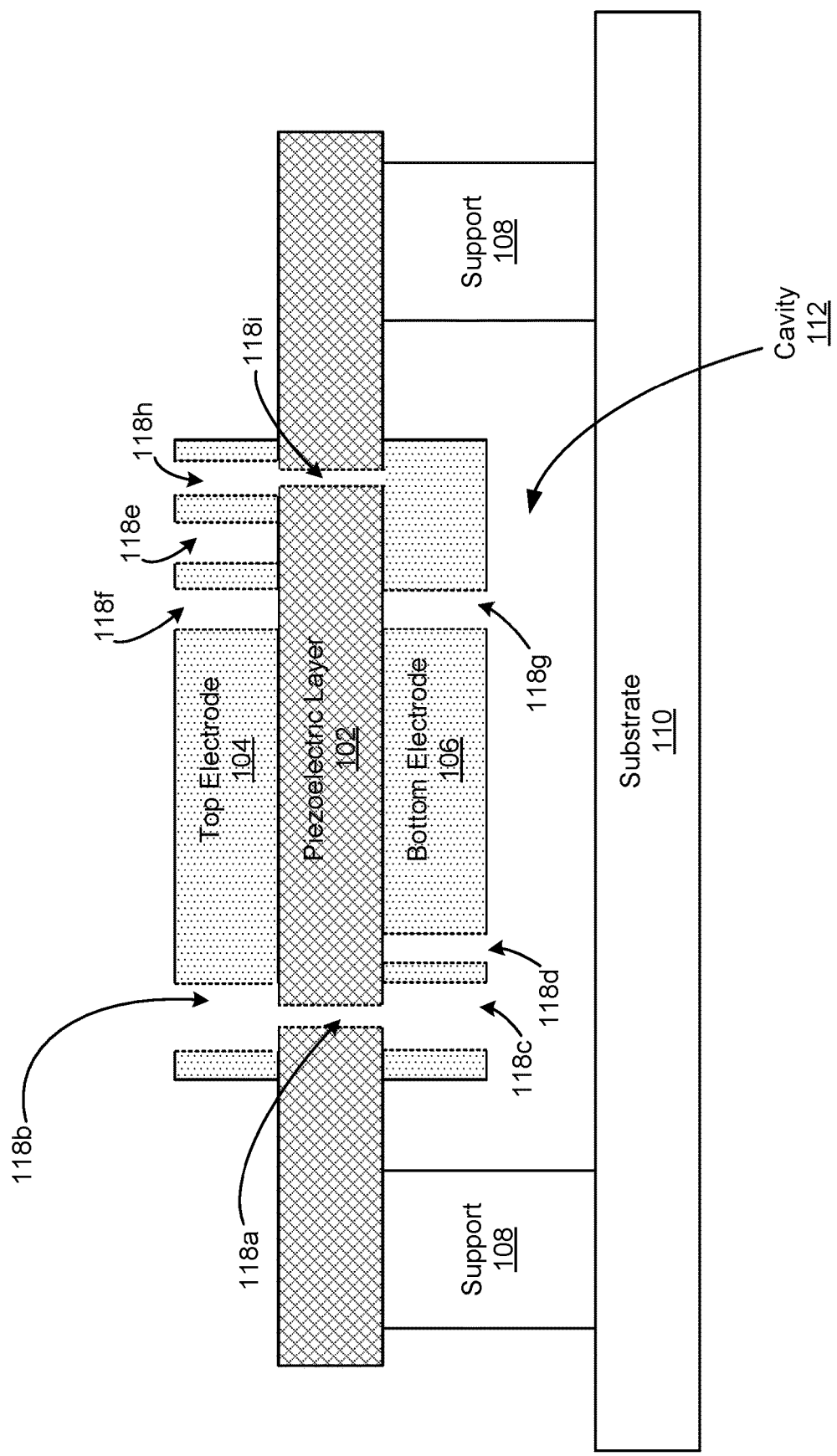

FIG. 5 is an illustrative cross-sectional diagram of a bulk acoustic resonator 100 that includes a plurality of perforations 118 in top electrode 104, a plurality of perforations 118 in piezoelectric layer 102, and a plurality of perforations 118 in bottom electrode 106, in accordance with some embodiments. The size of perforation 118a in piezoelectric layer 102 is smaller than the size of perforation 118b in top electrode 104 and/or the size of perforation 118c in bottom electrode 106. Perforation 118a in piezoelectric layer 102 is at least partially aligned with perforations 118b and 118c. Perforation 118d in bottom electrode 106 is not aligned with any perforations in piezoelectric layer 102 or top electrode 104. Perforation 118e in top electrode 104 is not aligned with any perforations in piezoelectric layer 102 or bottom electrode 106. Perforation 118f in top electrode 104 is aligned with perforation 118g in bottom electrode 106. Perforation 118h in top electrode 104 is at least partially aligned with perforation 118i in piezoelectric layer 102.

In FIGS. 3-5, the plurality of perforations 118 in top electrode 104, piezoelectric layer 102, and/or bottom electrode 106 reduce resonance of spurious waves (e.g., resonance due to reflections from the edges of the FBAR stack, such as lateral waves 116 as illustrated in FIG. 2B, and/or resonance due to reflections from the edges of the FBAR cavity). In some embodiments, one or more perforations in top electrode 104, piezoelectric layer 102, and/or bottom electrode 106 are used as an etchant channel for creating an FBAR cavity. For example, the at least one perforation includes a perforation in top electrode 104 (e.g., perforation 118b as shown in FIG. 5) that is aligned or substantially aligned with perforations in piezoelectric layer 102 (e.g., perforation 118a) and bottom electrode 106 (e.g., perforation 118c). In some embodiments, etchant flows through a channel that includes perforations 118b, 118a, and 118c (or perforations 118 as shown in FIG. 4, or other perforations that pass through all layers of the FBAR stack) to form cavity 112, and etchant and sacrificial material flow out of cavity 112 through the channel.

FIG. 6 is an illustrative cross-sectional diagram of a bulk acoustic resonator 100 in which cavity 112 below bottom electrode 106 includes a plurality of posts 120 that are coupled to bottom electrode 106 and substrate 110, in accordance with some embodiments. In some embodiments, posts 120 reduce resonance of spurious waves (e.g., resonance due to reflections from the edges of the FBAR stack, such as lateral waves 116 as illustrated in FIG. 2B, and/or resonance due to reflections from the edges of the FBAR cavity). In some embodiments, posts 120 provide mechanical support for the FBAR stack.

FIG. 7 is an illustrative cross-sectional diagram of a bulk acoustic resonator 100 in which cavity 112 below bottom electrode 106 includes a plurality of posts 120 (e.g., 120a, 120b, 120c, and/or 120d) and the FBAR stack includes a plurality of perforations (e.g., 118j, 118k, 118l, and/or 118m) in accordance with some embodiments. Perforation 118j in bottom electrode 106 is at least partially aligned with post 120a, which is coupled to piezoelectric layer 102 and substrate 110. Post 120b is coupled to bottom electrode 106 and substrate 110. Perforation 118k in top electrode 104 is at least partially aligned with perforation 118l in bottom electrode 106. Perforation 118k is at least partially aligned with post 120c, which is coupled to piezoelectric layer 102 and substrate 110. Perforation 118m in top electrode 104 is at least partially aligned with post 120d, which is coupled to bottom electrode 106 and substrate 110. In some embodiments, perforations 118 and/or posts 120 reduce resonance of spurious waves (e.g., from lateral waves reflecting from the edges of the stack, as illustrated in FIG. 2B). In some embodiments, posts 120 provide mechanical support for the FBAR stack (e.g., support for bottom electrode 106 and/or piezoelectric layer 102).

In some embodiments, posts 120 provide mechanical support for the FBAR stack, creating a more robust structure for bulk acoustic resonator 100. For example, inclusion of posts 120 in the structure of bulk acoustic resonator 100 reduces the probability of top electrode 104, bottom electrode 106, and/or piezoelectric layer 102 buckling (e.g., into cavity 112).

FIGS. 8A-8I illustrate cross-sectional views of a bulk acoustic resonator during formation of the bulk acoustic resonator 100, where formation of the bulk acoustic resonator 100 involves etching sacrificial layer material to form a cavity 112, in accordance with some embodiments.

Figure 8A:
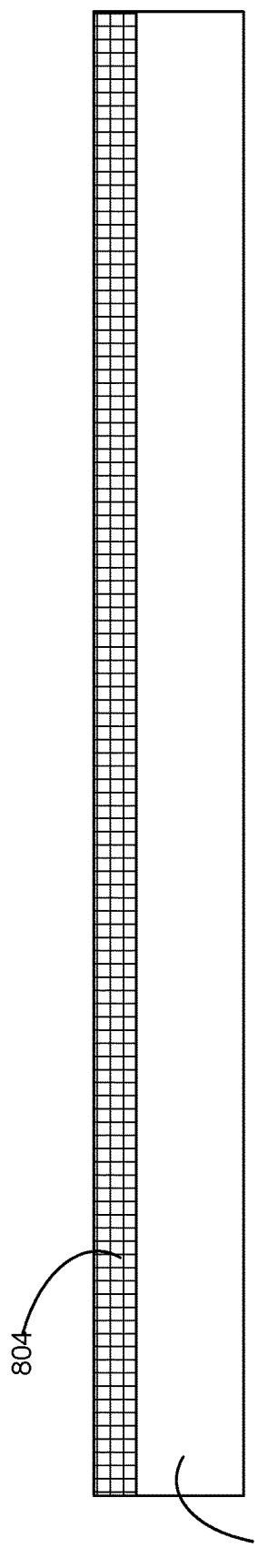
FIGS. 8A-8I illustrate an approach for formation of a bulk acoustic resonator that involves etching sacrificial layer material to form a cavity, in accordance with some embodiments.

In FIG. 8A, a layer of sacrificial material 804 (e.g., silicon dioxide), is formed on a substrate 802 (e.g., silicon, glass, ceramic, gallium arsenide and/or silicon carbide). For example, sacrificial material 804 is formed by chemical vapor deposition on substrate 802 or by thermal oxidation of substrate 802.

Figure 8B:
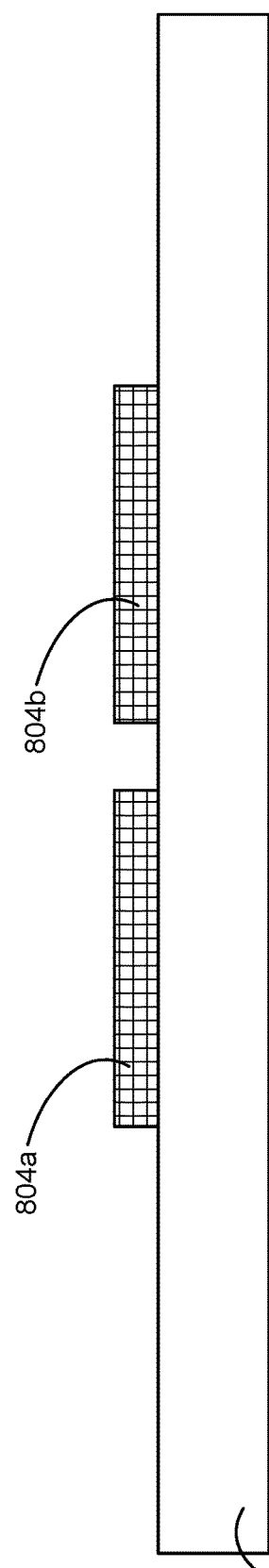

In FIG. 8B, a sacrificial material 804 is selectively removed, such that portions 804a and 804b of sacrificial material 804 remain.

Figure 8C:
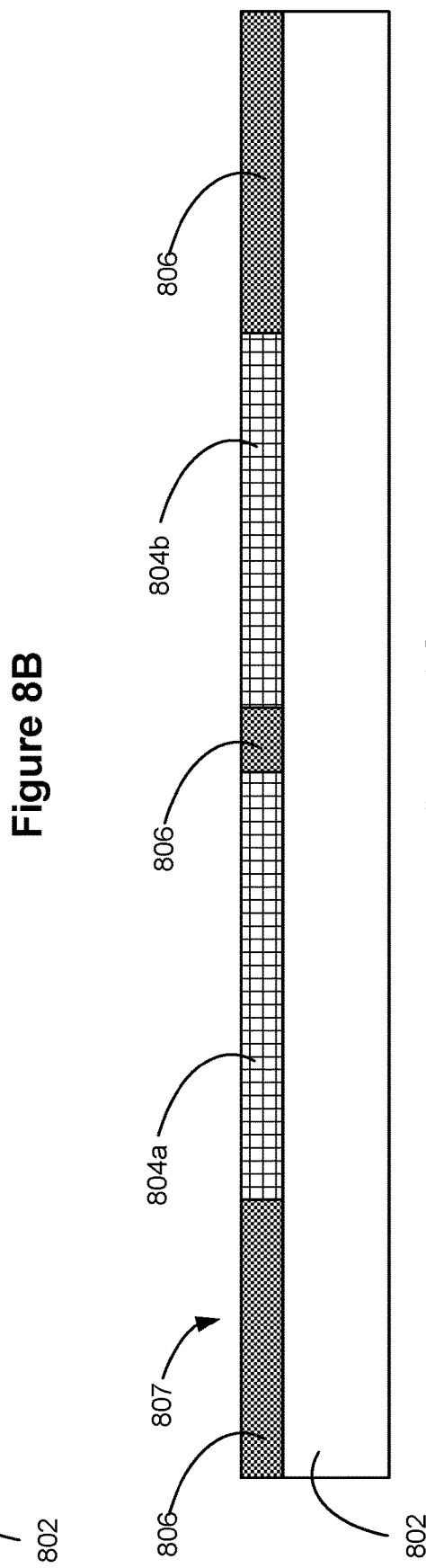

In FIG. 8C, a fill material 806 (e.g., polysilicon, aluminum, and/or silicon dioxide) is formed on the substrate 802 (e.g., filling the spaces on substrate 802 created by removal of the sacrificial material, such as the spaces between and/or surrounding remaining sacrificial material 804a and 804b). In some embodiments, upper surface 807 (e.g., the upper surface of fill material 806 and remaining sacrificial material 804a and 804b) is polished to obtain a flat surface.

Figure 8D:
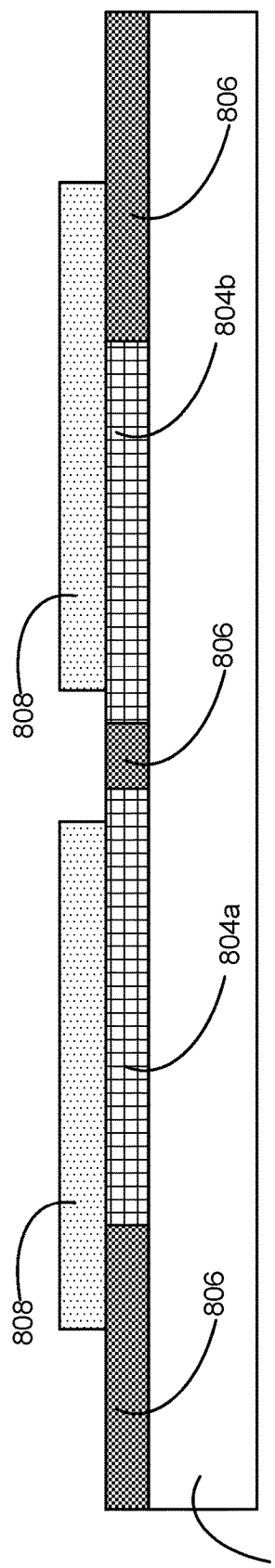

In FIG. 8D, a bottom electrode layer 808 (e.g., molybdenum, aluminum, and/or tungsten) is formed over the fill material 806 and/or the remaining sacrificial material 804. In some embodiments, bottom electrode 106, as described with regard to FIG. 1, is a bottom electrode layer 808 formed as described with regard to FIG. 8D.

Figure 8E:
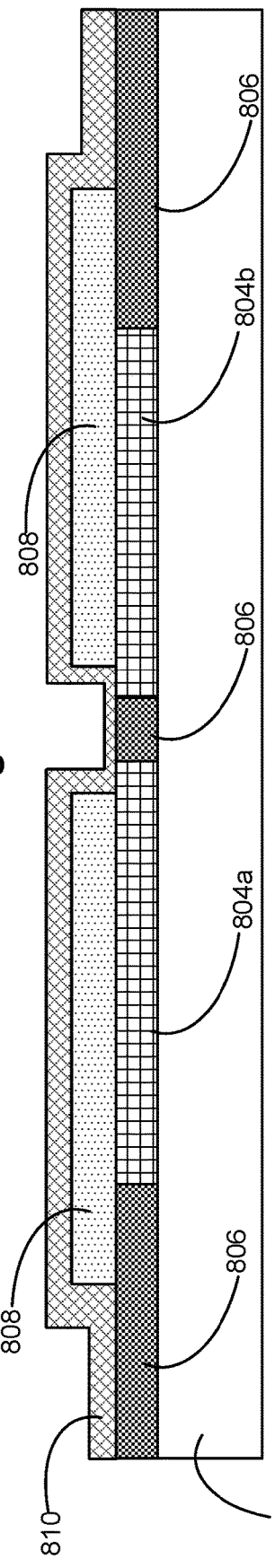

In FIG. 8E, a piezoelectric film layer 810 (e.g., aluminum nitride and/or zinc oxide) is formed over bottom electrode layer 808. In some embodiments, piezoelectric layer 102, as described with regard to FIG. 1, is a piezoelectric film layer 810 formed as described with regard to FIG. 8E.

Figure 8F:
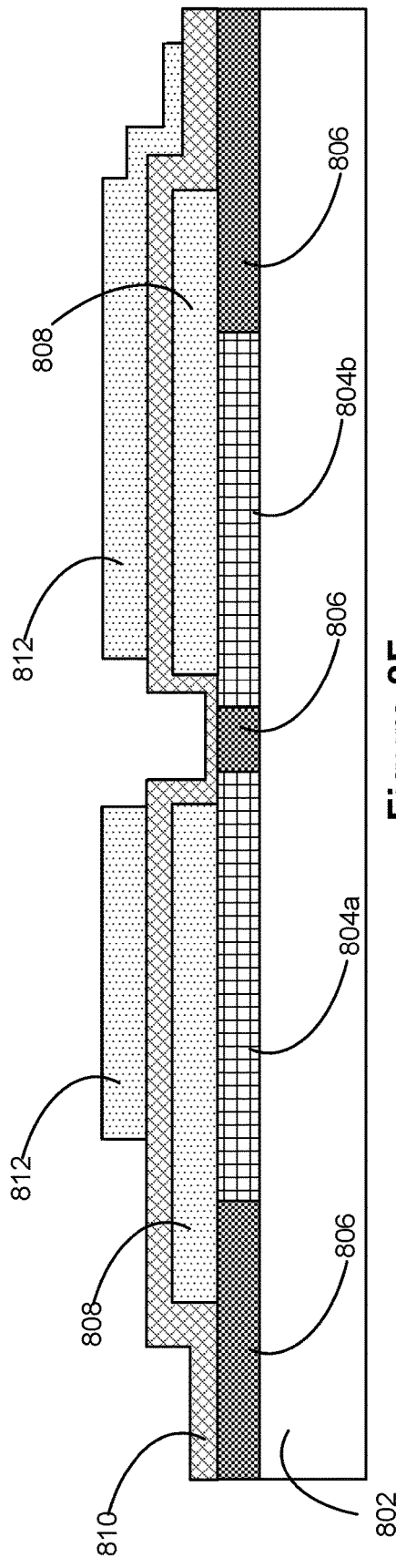

In FIG. 8F, a top electrode layer 812 (e.g., molybdenum, aluminum, and/or tungsten) is formed over the piezoelectric film layer 810. In some embodiments, top electrode 104, as described with regard to FIG. 1, is a top electrode layer 812 formed as described with regard to FIG. 8F.

Figure 8G:
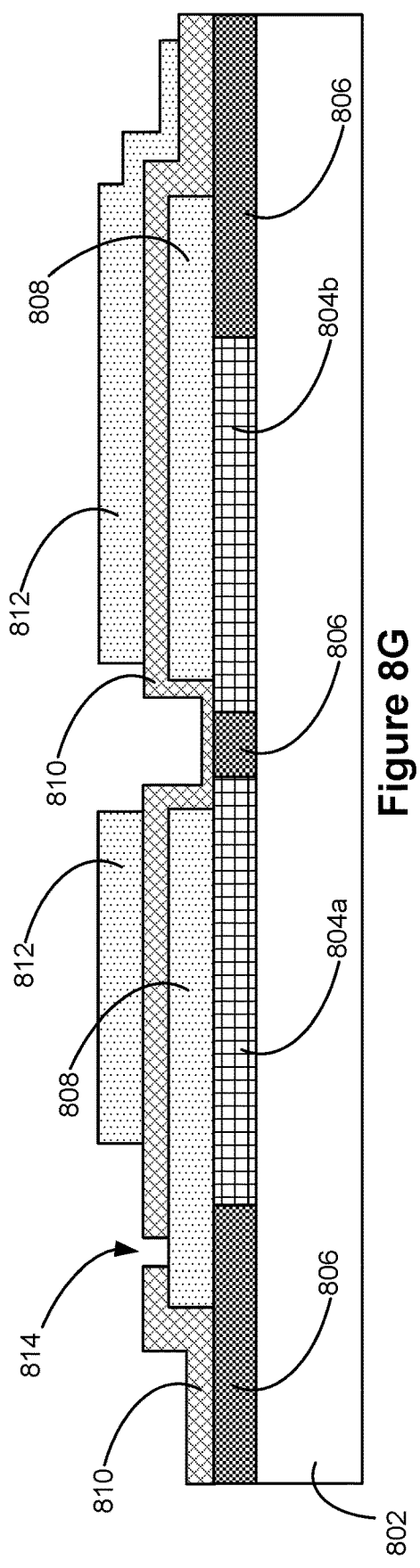

In FIG. 8G, material is selectively removed from piezoelectric film layer 810 to form a contact access gap 814. In some embodiments, material is selectively removed from piezoelectric film layer 810 to form a contact access gap 814 after formation of a top electrode layer 812. For example, material is selectively removed (e.g., by etching) from piezoelectric film layer 810 to create contact access gap 814. In some embodiments, perforations 118 in one or more of piezoelectric film layer 810, bottom electrode layer 808 and/or top electrode layer 812 are created (e.g., by etching) concurrently with creating of contact access gap 814. In some embodiments, material is selectively removed from one or more of top electrode layer 812, piezoelectric film layer 810, and/or bottom electrode layer 814 to form a channel. For example, etchant to form cavity 112 (e.g., by removal of sacrificial material 804a and 804b) flow into the bulk acoustic resonator structure through the channel, and removed sacrificial material 804 and used etchant flow out of the bulk acoustic resonator structure through the channel.

Figure 8H:
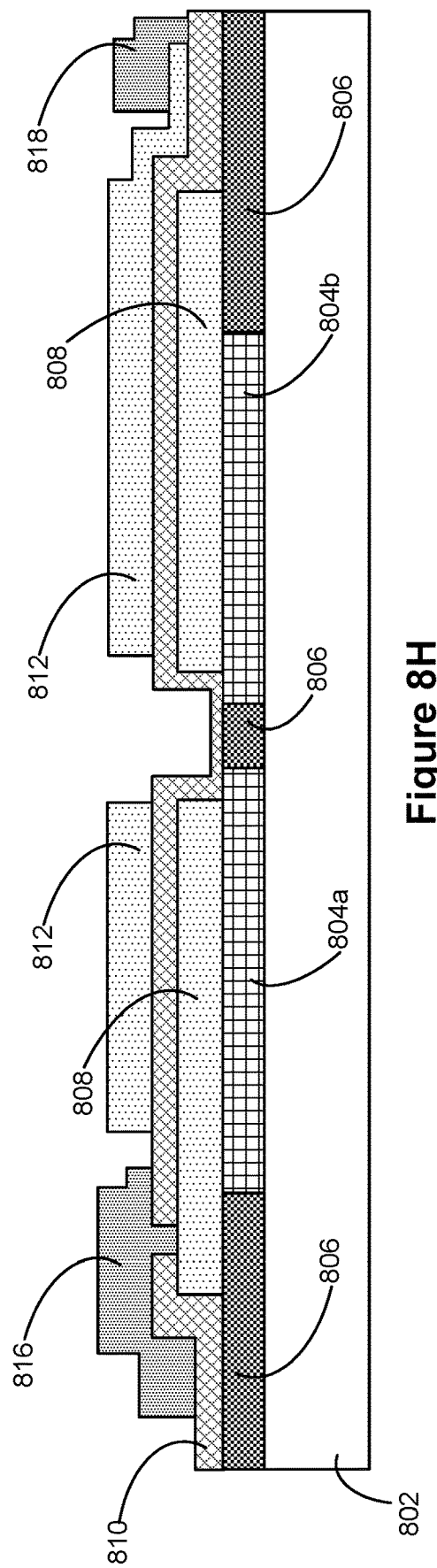

In FIG. 8H, a first contact 816 and a second contact 818 are formed. For example, first contact 816 (e.g., aluminum) is formed at least partially within contact access gap 814 to create an electrical contact with bottom electrode layer 808. In this way, first contact 816 provides a path by which an electrical signal travels between an electrical circuit and bottom electrode layer 808. A second contact 818 is formed at least partially in contact with top electrode layer 812. In this way, second contact 818 provides a path by which an electrical signal travels between an electrical circuit and top electrode layer 812.

Figure 8I:
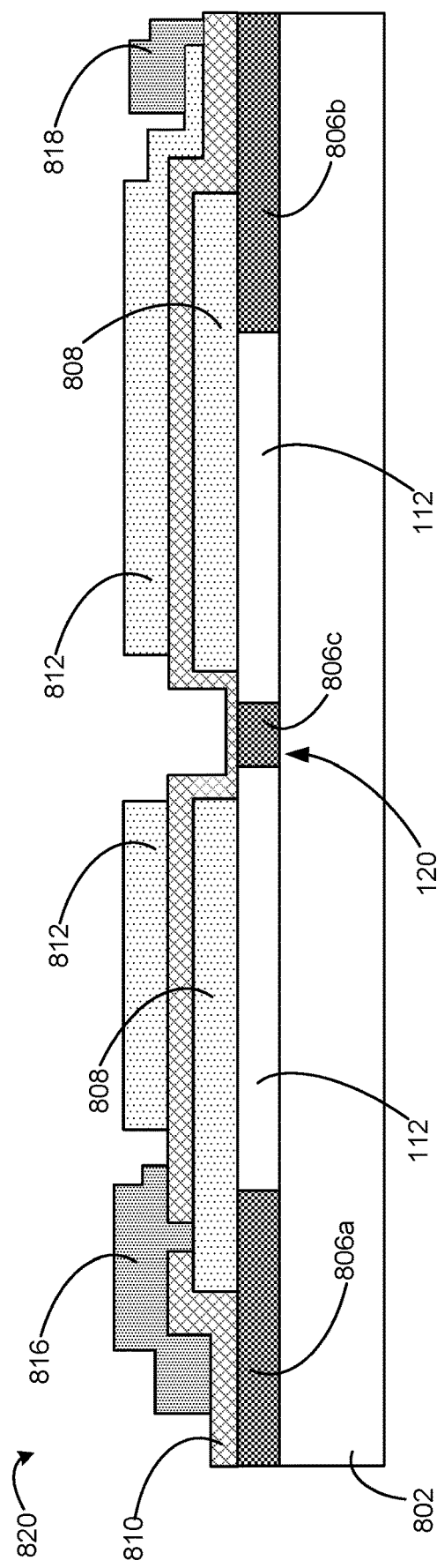

In FIG. 8I, a cavity 112 is formed by removing sacrificial material 804 (e.g., 804a and 804b as shown in FIG. 8H) from beneath bottom electrode layer 808. For example, etchant is applied at one or more points at the upper surface of the structure shown in FIG. 8H (e.g., at holes (not shown) in the upper surface of the structure shown in FIG. 8H) to etch away sacrificial material 804 and then the etching products are flushed out of the structure to form one or more cavities 112 as shown in FIG. 8I. In some embodiments, holes in one or more layers of FIG. 8H are perforations 118 (e.g., in top electrode 104, piezoelectric layer 102, and/or bottom electrode 106), such as the perforations 118 described with regard to FIG. 4 or 5). In some embodiments, support material 806a and 806b that remains when sacrificial material 804 is removed functions as one or more support members 108 (e.g., as described with regard to FIG. 1). In some embodiments, the structure shown in FIG. 8H (and/or a substrate 802 on which the structure shown in FIG. 8H is fabricated) is fabricated for removal of sacrificial material (e.g., by way of insertion and flushing of etchant) such that a plurality of posts 120 are formed of remaining support material 806c in cavity 112.

In some embodiments, bulk acoustic resonator 100, as described with regard to claim 1, is a bulk acoustic resonator 820 formed as described with regard to FIGS. 8A-8I.

FIGS. 9A-9B illustrate formation of perforations 118 in a bulk acoustic resonator 820.

In FIG. 9A, perforations 118 are created in top electrode layer 812 of bulk acoustic resonator 820. For example, etching is performed on top electrode layer 812 to create perforations in top electrode layer 812. In some embodiments, perforations are created in accordance with and/or using a pattern, such as part or all of one or more patterns described with regard to FIGS. 15-19.

In FIG. 9B, perforations 118 are created (e.g. all perforations 118 are concurrently created) in top electrode layer 812, piezoelectric film layer 810, and bottom electrode layer 808. In some embodiments, perforations are created in accordance with and/or using a pattern, such as part or all of one or more patterns described with regard to FIGS. 15-19. Furthermore, in some embodiments, formation of one or more cavities 112 occurs concurrently with one or more etch processes used for formation of perforations 119. When the etchant (of one or more etch processes) forms perforations 118 by passing through the top electrode, the piezoelectric film layer, and/or the bottom electrode, by way of perforations 118, it is not necessary to create separate etchant channels in substrate 110 to create the one or more cavities 112.

FIGS. 10A-10F illustrate cross-sectional views of a bulk acoustic resonator during formation of a bulk acoustic resonator 1020 (e.g., a bulk acoustic resonator similar to bulk acoustic resonator 100 shown in FIG. 1 that does not include material of substrate 110 beneath the FBAR stack), where formation of the bulk acoustic resonator 1020 involves backside etching, in accordance with some embodiments.

Figure 10A:
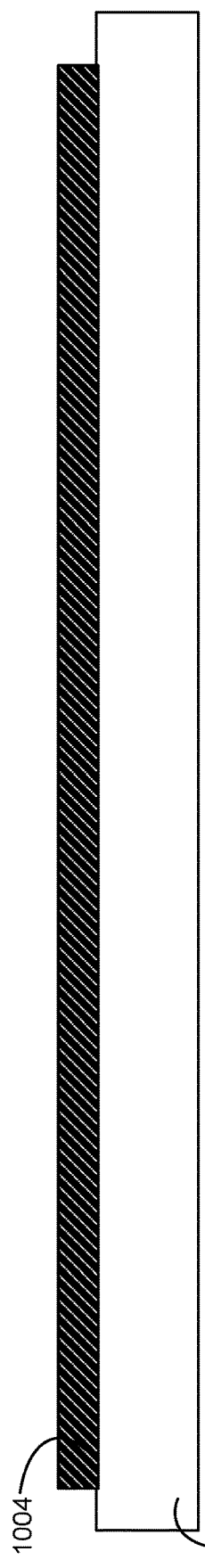
FIGS. 10A-10F illustrate a backside etching approach for formation of a bulk acoustic resonator, in accordance with some embodiments.

In FIG. 10A, a layer of support material 1004 (e.g., polysilicon, aluminum, and/or silicon dioxide) is formed on a substrate 1002, such as a semiconductor substrate (e.g., silicon, glass, ceramic, gallium arsenide and/or silicon carbide).

Figure 10B:
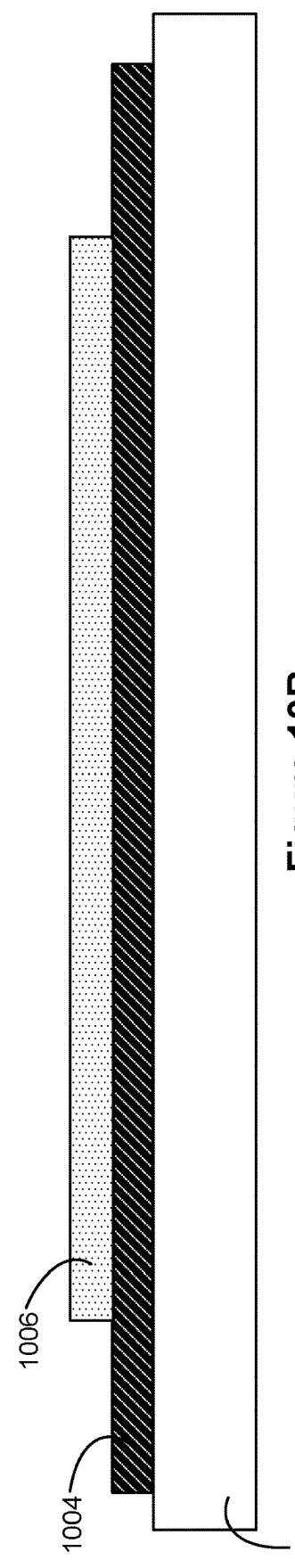

In FIG. 10B, a bottom electrode layer 1006 (e.g., molybdenum, aluminum, and/or tungsten) is formed over the support material layer 1004. In some embodiments, bottom electrode 106, as described with regard to FIG. 1, is a bottom electrode layer 1006 formed as described with regard to FIG. 10B.

In some embodiments, support material layer 1004 is omitted and bottom electrode layer 1006 is formed over substrate 1002.

Figure 10C:
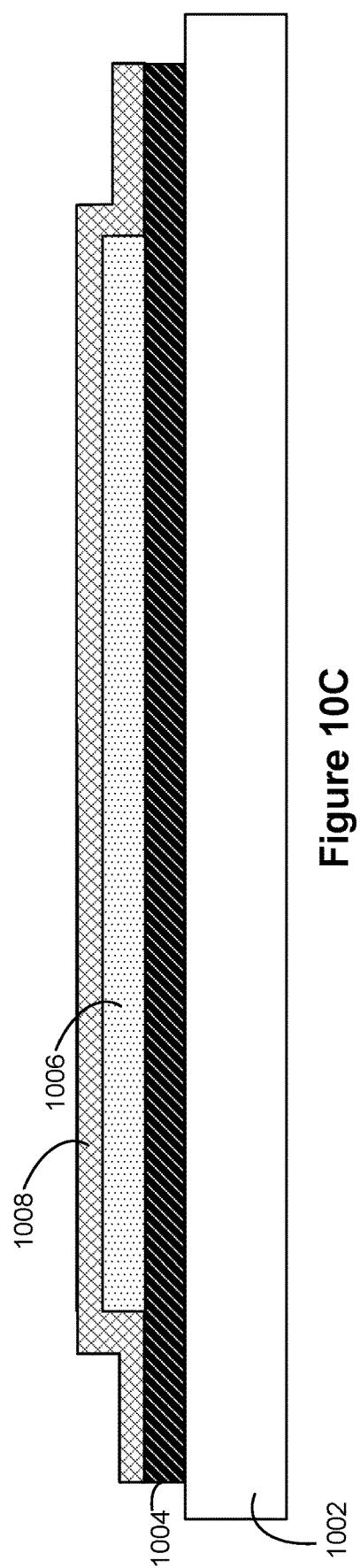

In FIG. 10C, a piezoelectric film layer 1008 (e.g., aluminum nitride and/or zinc oxide) is formed over the bottom electrode layer 1006. In some embodiments, piezoelectric layer 102, as described with regard to FIG. 1, is a piezoelectric film layer 1008 formed as described with regard to FIG. 10C.

Figure 10D:
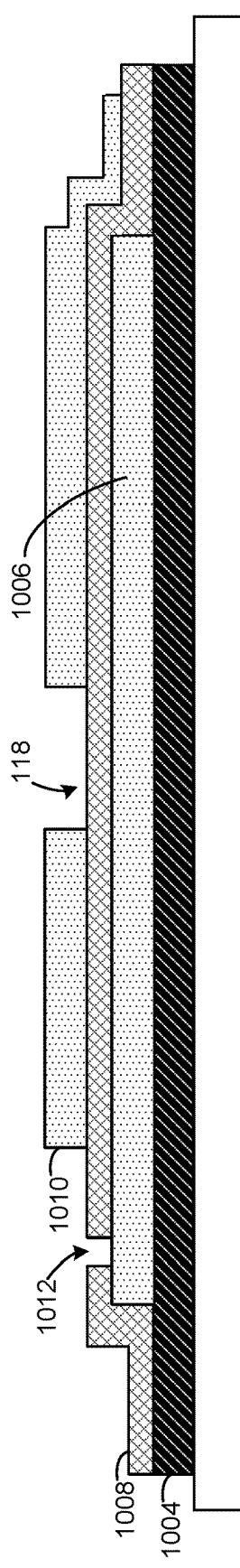

In FIG. 10D, a top electrode layer 1010 (e.g., molybdenum, aluminum, and/or tungsten) is formed over the piezoelectric film layer 1008. In some embodiments, top electrode 104, as described with regard to FIG. 1, is a top electrode layer 1010 formed as described with regard to FIG. 10D. In some embodiments, one or more perforations 118 are created in the top electrode layer 1010. For example, perforations 118 are formed as top electrode layer 1010 is deposited (e.g., using a pattern, such as part or all of one or more patterns described with regard to FIGS. 15-19). In some embodiments, etching is performed on top electrode layer 1010 to create perforations 118 (e.g., using a pattern, such as part or all of one or more patterns described with regard to FIGS. 15-19).

In some embodiments, material is selectively removed from piezoelectric film layer 1008 to form a contact access gap 1012 after formation of a top electrode layer 1010. For example, material is selectively removed (e.g., by etching) from piezoelectric film layer 1008 to create contact access gap 1012. In some embodiments, one or more perforations 118 are formed (e.g., by etching) concurrently with formation of contact access gap 1012.

Figure 10E:
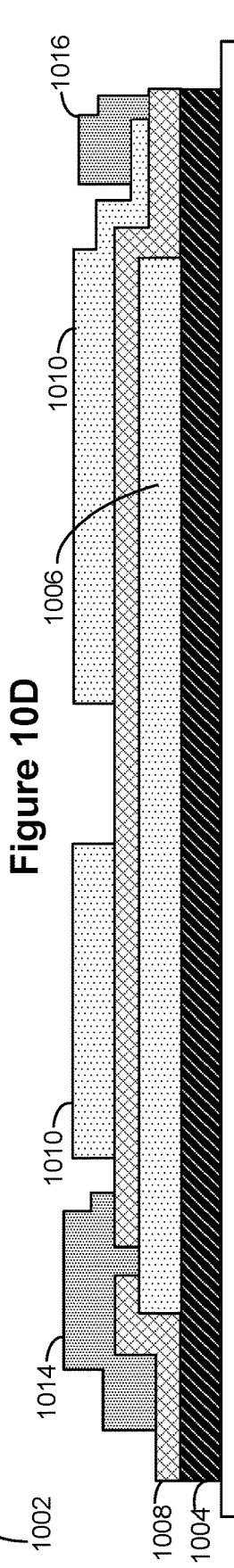

In FIG. 10E, a first contact 1014 and a second contact 1016 are formed. For example, first contact 1014 (e.g., aluminum) is formed at least partially within contact access gap 1012 to create an electrical contact with bottom electrode layer 1006. In this way, first contact 1014 provides a path by which an electrical signal travels between an electrical circuit and bottom electrode layer 1006. A second contact 1016 is formed at least partially in contact with top electrode layer 1010. In this way, second contact 1016 provides a path by which an electrical signal travels between an electrical circuit and top electrode layer 1010.

Figure 10F:
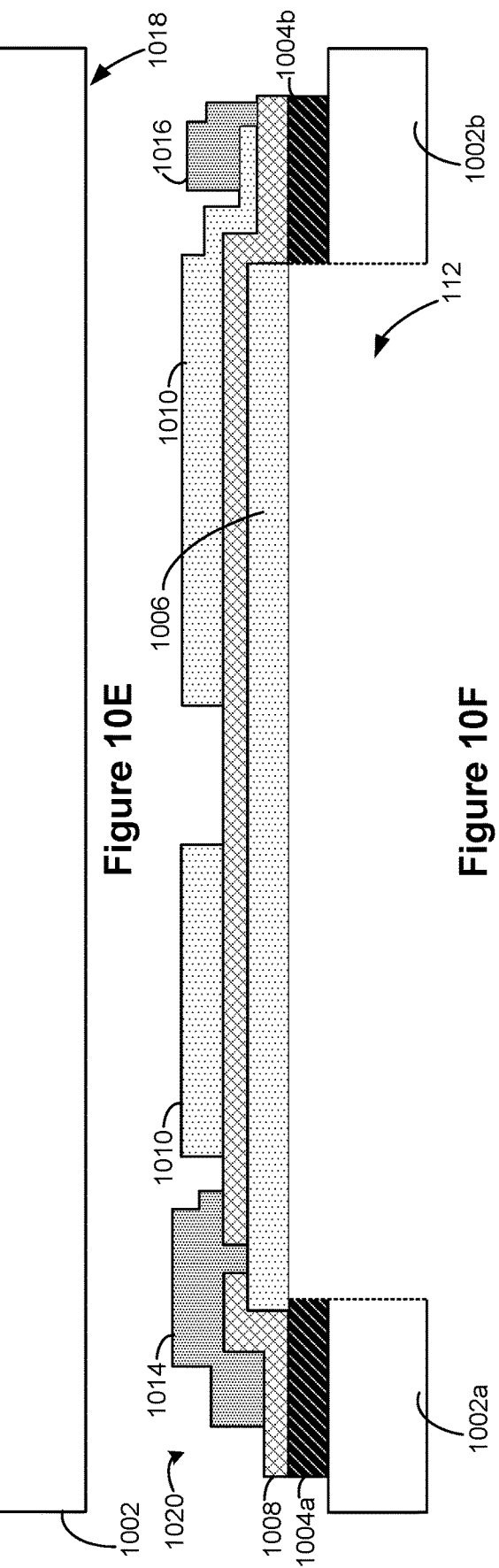

In FIG. 10F, a cavity 112 is formed from removing a portion of substrate 1002 and support material 1004 from the "backside" of substrate 1002. For example, etchant is applied to a portion of lower surface 1018 of substrate 1002, as indicated at FIG. 10E, to create an opening (e.g., a cavity 112). In some embodiments, the remaining substrate material 1002a and 1002b of substrate 1002 and (if the structure includes support material layer 1004) remaining support material 1004a and 1004b of support material layer 1004 functions as one or more support members 108 as indicated in FIG. 1.

In some embodiments, bulk acoustic resonator 100 (that does not include material of substrate 110 beneath the FBAR stack) is a bulk acoustic resonator 1020 formed as described with regard to FIGS. 10A-10F.

FIGS. 11A-11B illustrate formation of perforations 118 and beams 120 in a bulk acoustic resonator 1020, in accordance with some embodiments.

In FIG. 11A, perforations 118 are created (e.g. created by the one or more etching processes) in top electrode layer 1010, piezoelectric film layer 1008, and bottom electrode layer 1006. In some embodiments, perforations 118 are created by etchant applied to upper surface 1102 of cavity 112. In some embodiments, perforations 118 are created by etchant applied to upper surface 1104 of top electrode layer 1010. In some embodiments, perforations are created in accordance with and/or using a pattern, such as part or all of one or more patterns described with regard to FIGS. 15-19.

FIG. 11B illustrates cavity formation in bulk acoustic resonator 1020 using an alternative approach to the cavity formation approach described with regard to FIG. 10F. In FIG. 11B (which occurs, e.g., after formation of contacts 1014 and 1016 as described with regard to FIG. 10E) cavity 112 is formed such that one or more beams 1106 are formed within cavity 112. For example, etchant is applied to a portion of lower surface 1018 of substrate 1002, as indicated at FIG. 10E, such that remaining material 1002c and 1002d of substrate 1002 and (if the structure includes support material layer 1004) remaining support material 1004c and 1004d form beams 1106 in cavity 112. In some embodiments, the beams 1106 support the FBAR stack and strengthen the FBAR stack due to their thickness and rigidity. In some embodiments, at least one of the beams 1106 spans at least half of a distance across cavity 112 (or across a length of at least one element of the FBAR stack), such as 80% of a distance across cavity 112 (or across a length of at least one element of the FBAR stack). In the illustrative example of FIG. 11C, the beams extend diagonally across piezoelectric layer 102. In FIG. 11B, dotted lines outline the portions of the beams 1106 that are beyond the cross-sectional view of FIG. 11B.

Figure 19:
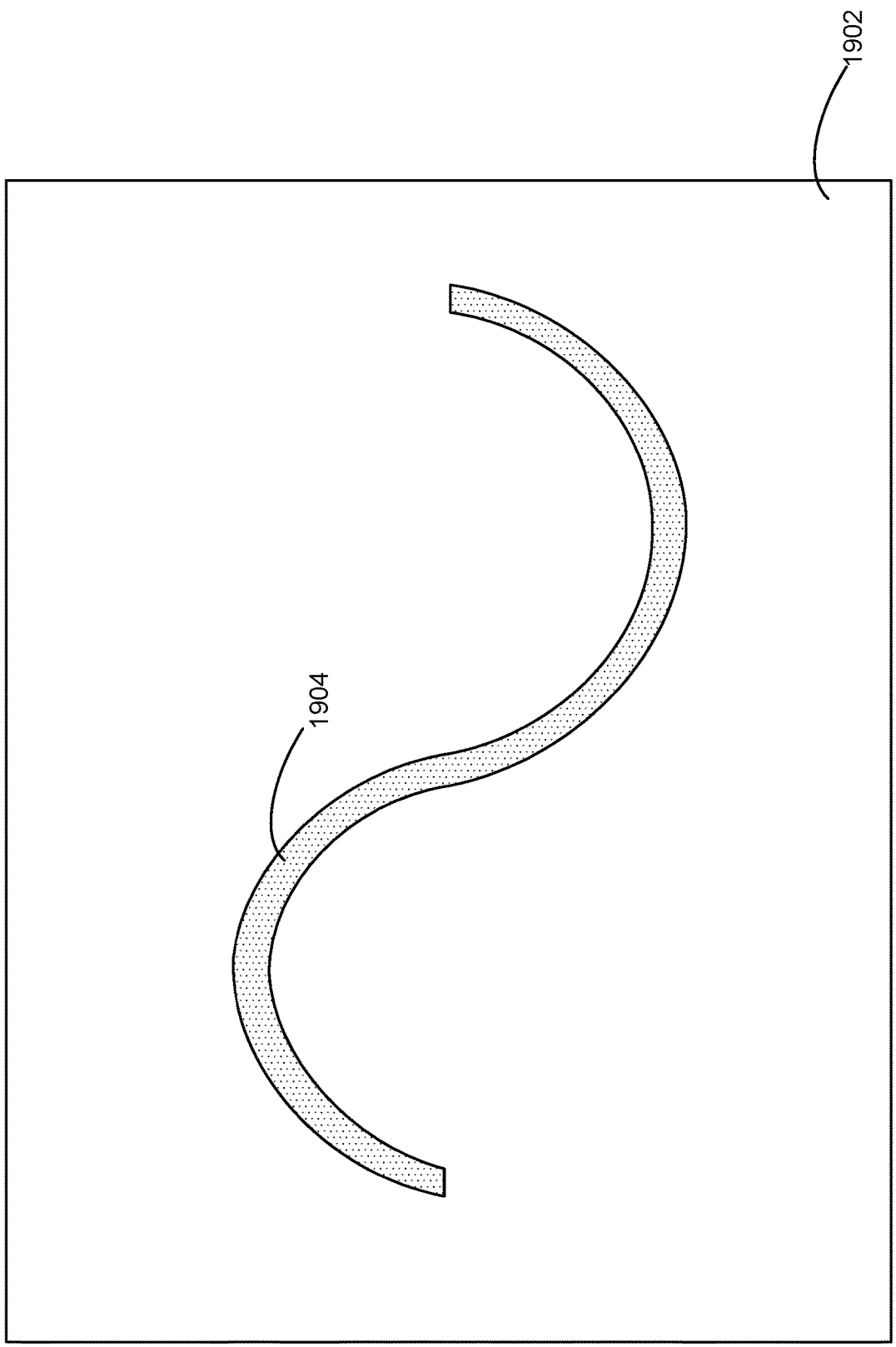
FIG. 19 illustrates a perforation pattern for a perforation used for cavity formation and/or a beam, in accordance with some embodiments.

FIG. 11C is a top down view of beams 1106a and 1106b. Beams 1106a and 1106b are shown with dotted lines in locations where the beams are located below the FBAR stack. It will be recognized that different angles between beams 1006a and 1006b are used in various embodiments. Although the beams 1106 are illustrated as intersecting rectangles, in some embodiments, one or more of the individual beams (e.g., 1106a and/or 1106b) do not have straight edges. For example, in some embodiments, a beam has a "staircase" or "zigzag" shape, or the S-shape of feature 1904 as illustrated in FIG. 19, rather than a rectangular shape.

FIGS. 12-14 illustrate exemplary perforation configurations in a bulk acoustic resonator 100 formed by a backside etching approach (e.g., as described with regard to FIGS. 10A-10F and/or FIGS. 11A-11B), in accordance with some embodiments.

FIG. 12 is a is a cross-sectional diagram of a bulk acoustic resonator 100 that includes a plurality of perforations 118 in top electrode 104 and a plurality of perforations 118 in bottom electrode 106, in accordance with some embodiments.

FIG. 13 is a cross-sectional diagram of a bulk acoustic resonator 100 that includes a plurality of perforations 118 that pass through top electrode 104, piezoelectric layer 102, and bottom electrode 106, in accordance with some embodiments. The perforations 118 in piezoelectric layer 102 align with the perforations 118 in top electrode 104 and with the perforations 118 in bottom electrode 106.

FIG. 14 is a cross-sectional diagram of a bulk acoustic resonator 100 that includes a plurality of perforations 118 in top electrode 104, a plurality of perforations 118 in piezoelectric layer 102, and a plurality of perforations 118 in bottom electrode 106, in accordance with some embodiments. The size of perforation 118a in piezoelectric layer 102 is smaller than the size of perforation 118b in top electrode 104 and the size of perforation 118c in bottom electrode 106. Perforation 118a in piezoelectric layer 102 is at least partially aligned with perforations 118b and 118c. Perforation 118d in bottom electrode 106 is not aligned with any perforations in piezoelectric layer 102 or top electrode 104. Perforation 118e in top electrode 104 is not aligned with any perforations in piezoelectric layer 102 or bottom electrode 106.

In FIGS. 11A and 12-14, the plurality of perforations 118 in top electrode 104, piezoelectric layer 102, and/or bottom electrode 106 reduce resonance of spurious waves (e.g., waves reflected from the edges of the stack, as illustrated in FIG. 2B) and/or provide a channel by which etchant for forming cavity 112 flows. In FIG. 11B, beams 1106 provide mechanical support for the FBAR stack, creating a more robust structure for bulk acoustic resonator 100, and, in some embodiments, also suppressing lateral wave resonances.

FIGS. 15-19 illustrate various patterns for perforations, beams, and/or posts in top electrode 104, piezoelectric layer 102, and/or bottom electrode 106, in accordance with some embodiments. While the features of FIGS. 15-19 are described as representing locations of perforations through particular layers of bulk acoustic resonator 100, support posts, and/or beams, it will be recognized that any feature may indicate a location of a post 120 and/or a perforation through bottom electrode layer 106, piezoelectric layer 102, and/or top electrode 104, in accordance with some embodiments. It will be recognized that various arrangements, shapes, sizes, and positions of features in addition to those described with regard to FIGS. 15-19 may be used, in accordance with some embodiments.

Figure 15:
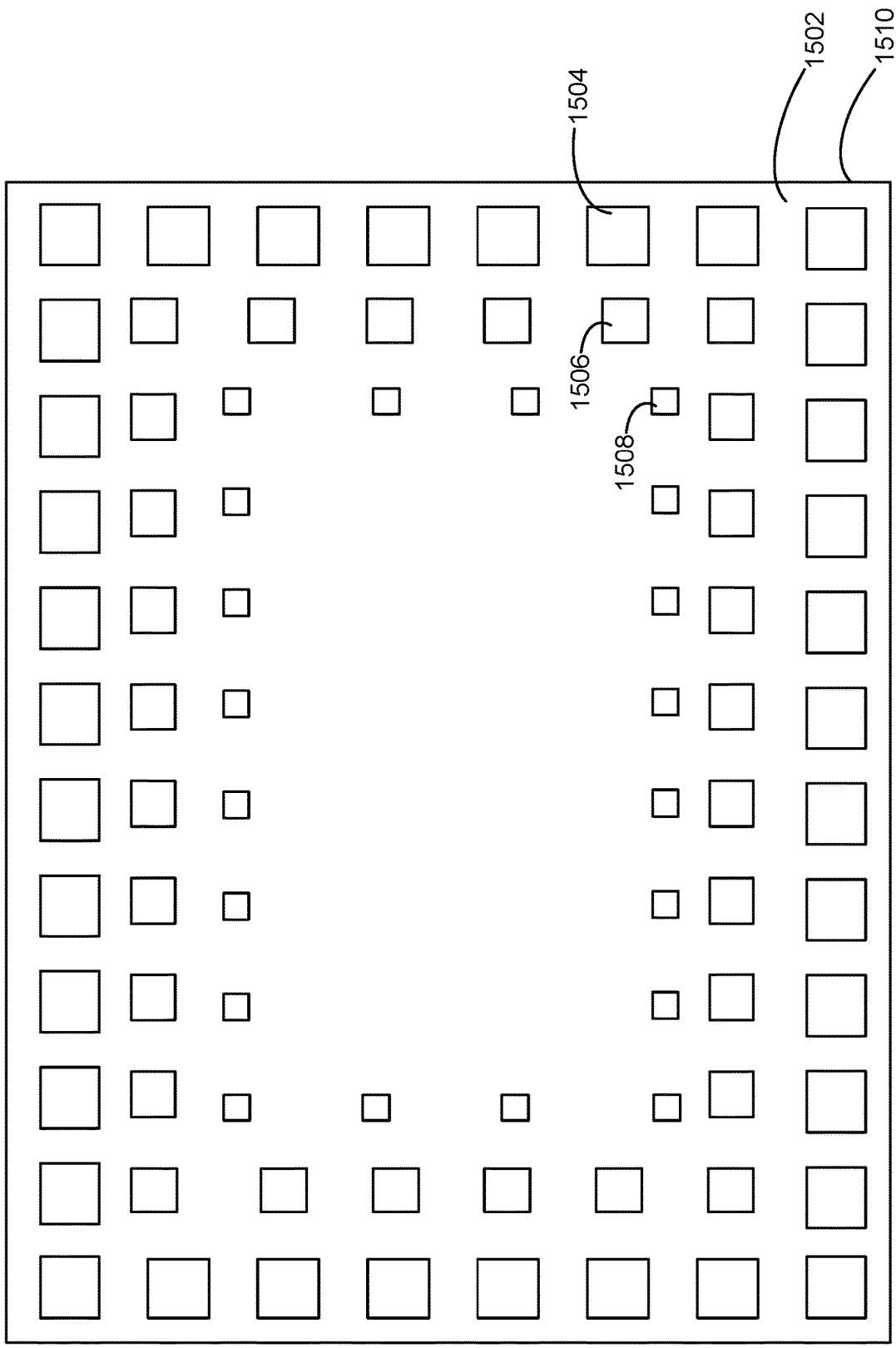
FIGS. 15-18 illustrate various patterns for perforations and/or posts in a top electrode, piezoelectric layer, and/or bottom electrode, in accordance with some embodiments.

FIG. 15 illustrates a pattern 1502 with a first set of features 1504 (e.g., features arranged along the interior of a perimeter 1510 of pattern 1502) that have a first size, a second set of features 1506 (e.g., features arranged along the interior of a perimeter formed by the first set of features 1504) that have a second size that is different (e.g., smaller) from the first size, and a third set of features 1508 (e.g., features arranged along the interior of a perimeter formed by the second set of features 1506) that have a third size that is different (e.g., smaller) from the first size and the second size. Additionally, a first set of features 1504 (e.g., features arranged along the interior of a perimeter 1510 of pattern 1502) have a first density, a second set of features 1506 (e.g., features arranged along the interior of a perimeter formed by the first set of features 1504) that have a second density that is different from the first density, and a third set of features 1508 (e.g., features arranged along the interior of a perimeter formed by the second set of features 1506) that have a third density that is different from the first density and the second density. In some embodiments, features 1504, 1506, and/or 1508 are rectangular (e.g., square-shaped) features. In some embodiments, features 1504, 1506, and/or 1508 indicate locations of perforations 118 in top electrode 104. In some embodiments, features 1504, 1506, and/or 1508 indicate locations of perforations 118 in bottom electrode 106. In some embodiments, features 1504, 1506, and/or 1508 indicate locations of perforations 118 in piezoelectric layer 102. In some embodiments, features 1504, 1506, and/or 1508 indicate locations of posts 120 that support bottom electrode 106.

Figure 16:
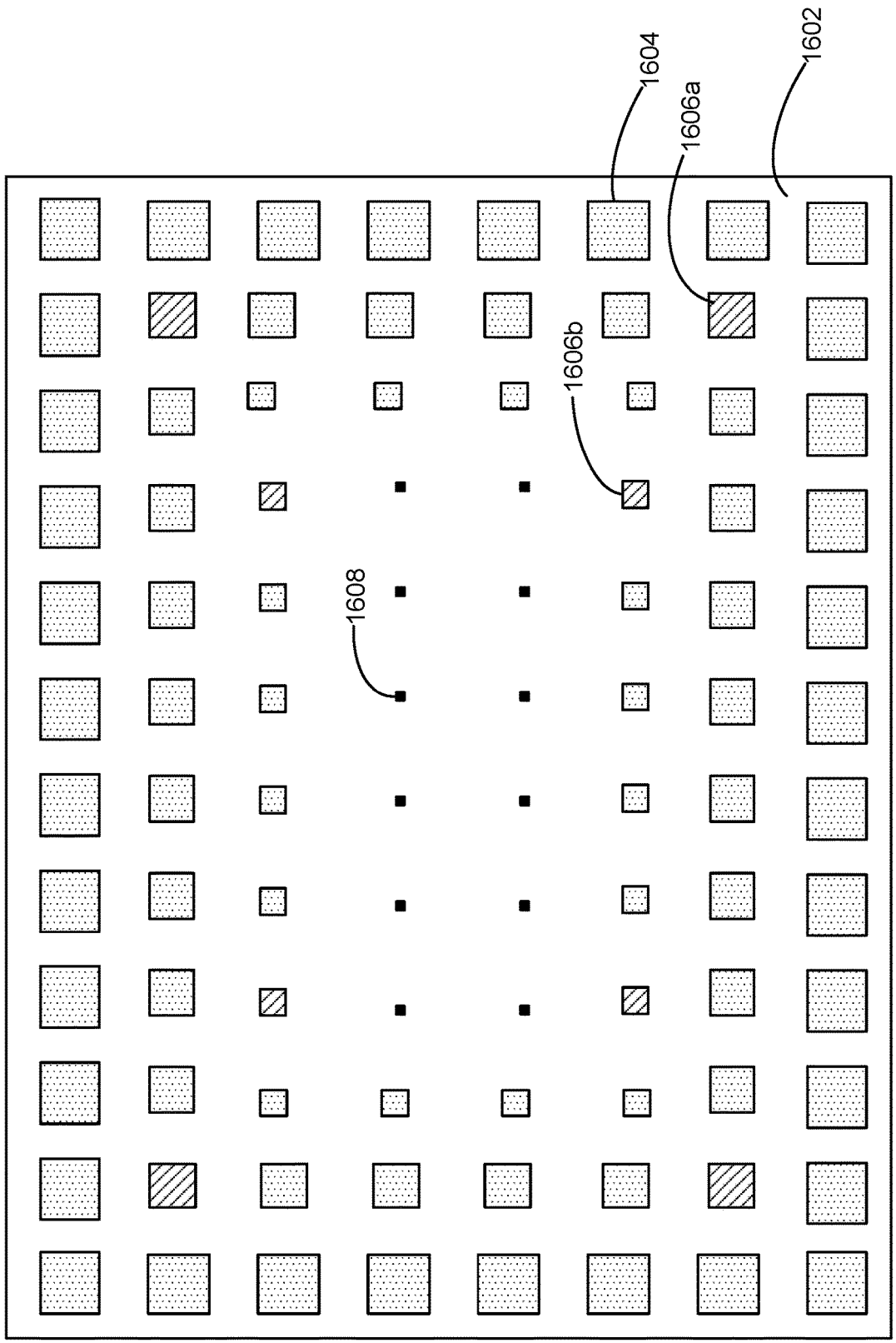

FIG. 16 illustrates a pattern 1602 with features 1604 indicated by a spotted fill, features 1606 indicated by a diagonally striped fill, and features 1608 indicated by a solid black fill. In some embodiments, features 1604 indicate locations of perforations 118 that pass through piezoelectric layer 102 and also pass through top electrode 104 and/or bottom electrode 106. In some embodiments, features 1606 (e.g., 1606a, 1606b) indicate locations of posts 120 that support bottom electrode 106. In some embodiments, features 1608 indicate locations of perforations 118 in top electrode 104 (e.g., that do not pass through bottom electrode 106 and piezoelectric layer 102).

In some embodiments, features 1604, 1606, and/or 1608 are rectangular (e.g., square-shaped) rectangular features, while in other embodiments at least some features of a respective perforations pattern or posts pattern are not rectangular.

In some embodiments, the variable density of perforations in patterns 1502 and/or 1602 is used to suppress resonance of spurious waves (e.g., by reflecting lateral waves). For example, the density of perforations in pattern 1602 decreases from the outer edge to the center of pattern 1602, e.g., such that the density of perforations adjacent to the outer edge of pattern 1602 is higher than the density of perforations adjacent to the center of pattern 1602. The lack of a sharp transition in the density of features (e.g., reduction of density of features from the edge to the center) reduces the reinforcement of edge reflections that give rise to spurious resonances.

Figure 17:
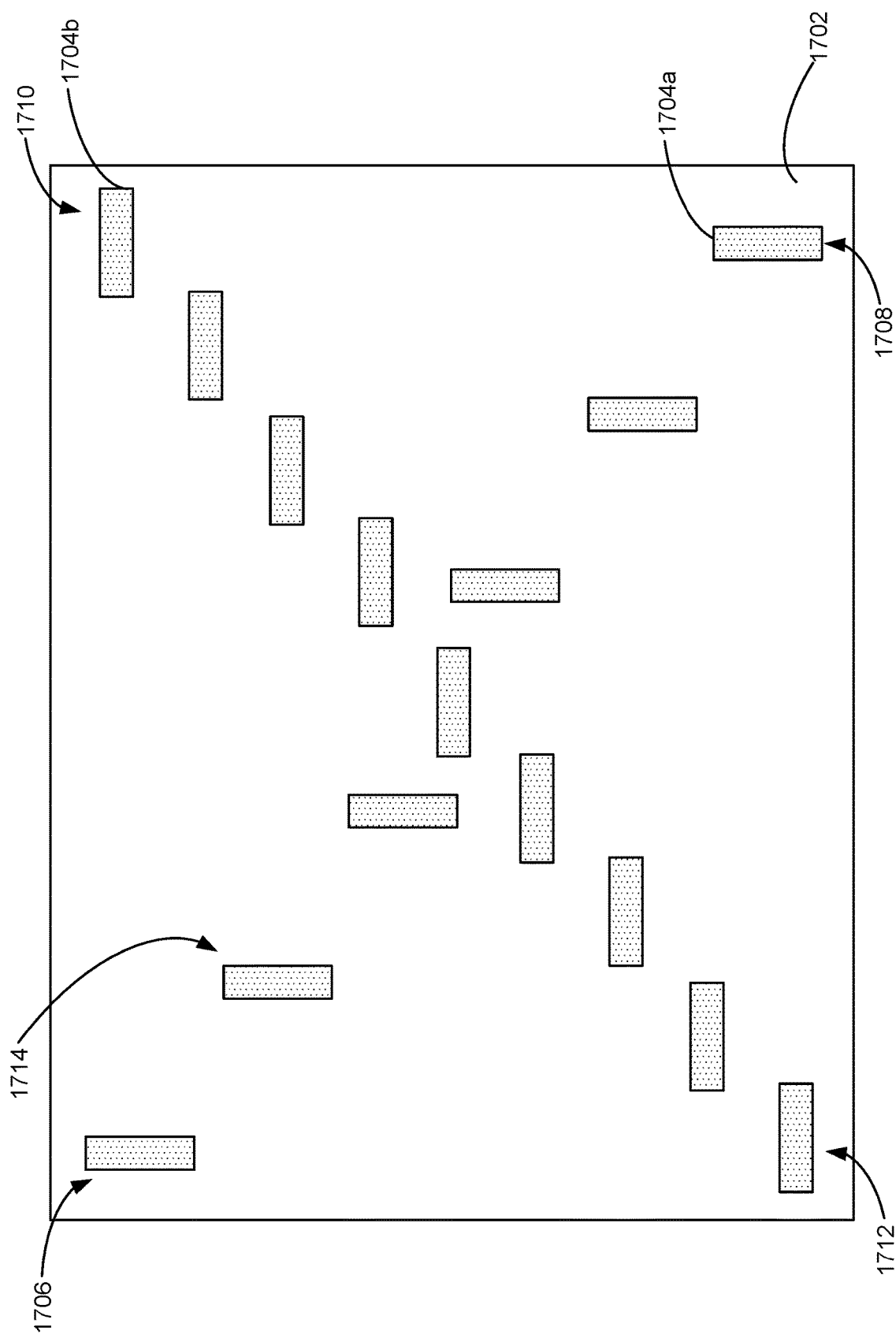

FIG. 17 illustrates a pattern 1702 with features 1704 (e.g., 1704a and 1704b). In some embodiments, features 1704 indicate locations of perforations 118 that pass through piezoelectric layer 102 and also pass through top electrode 104 and/or bottom electrode 106. In some embodiments, features 1704 are rectangular (e.g., oblong) features. In some embodiments, a first subset of features 1704 is distributed along a first diagonal of pattern 1702 (e.g., a diagonal that extends from point 1706 to point 1708) and a second subset of features 1704 is distributed along a second diagonal of pattern 1702 (e.g., a diagonal that extends from point 1710 to point 1712). In some embodiments, the first subset of features 1704 (e.g., features 1704a along the diagonal that extends from point 1706 to point 1708) has a first orientation and a second subset of features 1704 (e.g., features 1704b along the diagonal that extends from point 1710 to point 1712) has a second orientation that is different from the first orientation. For example, the orientation of rectangular features 1704 along the diagonal that extends from point 1706 to point 1708 is perpendicular to the orientation of rectangular features 1704 along the diagonal that extends from point 1710 to point 1712.

In some embodiments, the variable distance of perforations in pattern 1702 from the edge of the pattern is used to suppress resonance of spurious waves (e.g., by reflecting lateral waves). For example, perforation 1706 is a first distance from the left edge of pattern 1702 as illustrated in FIG. 17 and perforation 1714 is a second distance from the left edge of pattern 1702 that is greater than the first distance from the edge of pattern 1702. The distance between perforations in the diagonal extending from point 1706 to 1708 is different from the distance between perforations in the diagonal extending from point 1712 to point 1710. In some embodiments, resonance of spurious waves is suppressed by the variable distances between perforations and/or between perforations and the edge of the material in which the perforations are formed by pattern 1702 because the features prevent reinforcement of reflections from the edges of layers (e.g., top electrode 104, piezoelectric layer 102, and/or bottom electrode 106) of the FBAR stack, and/or from the edge of the cavity.

In some embodiments, at least some of the features of a respective perforations pattern or posts pattern are not rectangular, but have a distribution pattern having one or more characteristics of the patterns shown in FIGS. 15, 16 and 17.

Figure 18:
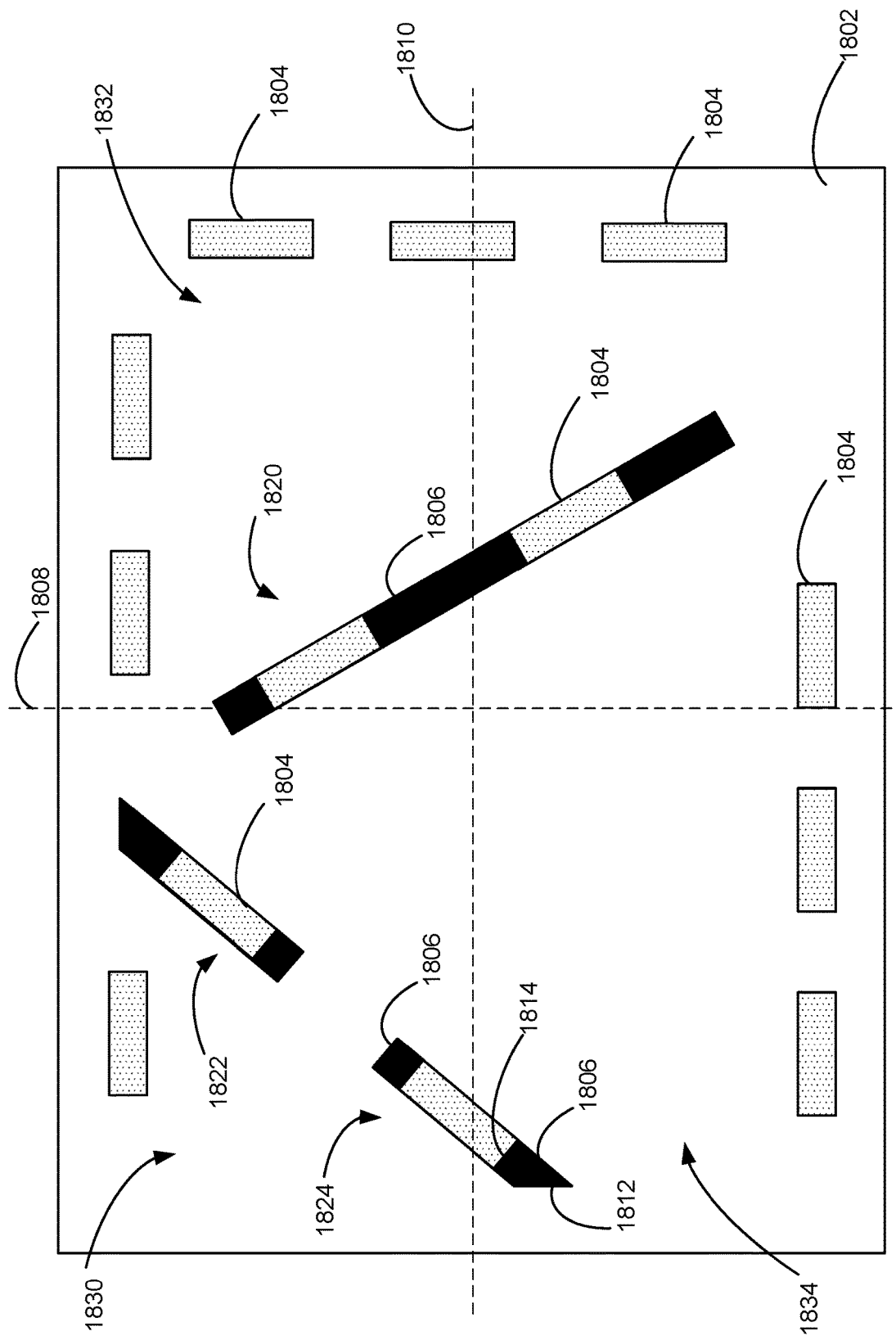

FIG. 18 illustrates a pattern 1802 with features 1804 indicated by a spotted fill and features 1806 indicated by a solid black fill. In some embodiments, features 1804 indicate locations of perforations 118 that pass through piezoelectric layer 102 and also pass through top electrode 104 and/or bottom electrode 106. In some embodiments, features 1804 are rectangular (e.g., oblong) features. In some embodiments, features 1806 indicate locations of perforations 118 in top electrode 104 (e.g., that do not pass through bottom electrode 106 and piezoelectric layer 102). Pattern 1802 is asymmetrical with respect to centerline 1808 that divides the left half of pattern 1802 from the right half of pattern 1802. For example, the number of features 1804 to the right of centerline 1810 is greater than the number of features 1804 to the left of centerline 1810. Pattern 1802 is also asymmetrical with respect to centerline 1810 that divides the top half of pattern 1802 from the bottom half of pattern 1802. For example, locations of features 1804 and 1806 above centerline 1810 do not correspond to locations of features 1804 and 1806 below centerline 1810. In some embodiments, at least a subset of features 1806 have non-parallel edges (e.g., as illustrated by edges 1812 and 1814).

In some embodiments, reinforcement of edge reflections that give rise to spurious resonances is suppressed by features with edges that are not parallel to the edge of the electrode, such as the features 1822, 1824, and/or 1820 shown in pattern 1802. For example, perforations formed in accordance with pattern 1802 suppress resonance of spurious waves (e.g., by reflecting lateral waves) by having edges that are not parallel to the edges of the electrodes (e.g., top electrode 104, piezoelectric layer 102, and/or bottom electrode 106) in the FBAR stack.

In some embodiments, resonance of spurious waves is suppressed by features formed in accordance with pattern 1802 that divide one or more layers (e.g., top electrode 104, piezoelectric layer 102, and/or bottom electrode 106) of the FBAR stack into nonsymmetrical shapes. For example, features 1822, 1824, and 1826 divide at least one layer into three roughly triangular-shaped portions 1830, 1832, and 1834. In some embodiments, the division of one or more layers of the FBAR stack into three roughly triangular-shaped portions 1830, 1832, and 1834 prevents reinforcement of edge reflections that give rise to spurious resonances.

Parallel edges and symmetrical features create conditions in which resonance can occur (e.g., due to wave superposition that occurs when waves are reflected from parallel, uniform surfaces). Spurious resonance of waves is reduced by introducing features such as asymmetrical features, features with non-parallel edges, features with varying densities, features with varying distances from the stack edge, features with differing orientations, and/or features that divide the stack into non-uniform sections.

FIG. 19 illustrates a pattern 1902 with a feature 1904 (e.g., an S-shaped feature). Typically, pattern 1902 is used to form a perforation that passes through top electrode 104, piezoelectric layer 102, and bottom electrode 106 for use as an etchant channel. For example, etchant for forming a cavity 112 between bottom electrode 106 and substrate 110 flows through the channel to form the cavity, and used etchant and sacrificial material are removed by way of the channel. In some embodiments, a beam to support an FBAR stack is formed in accordance with perforation pattern 1902. In some embodiments, one or more features formed in accordance with pattern 1902 also functions to suppress spurious lateral wave resonances (e.g., by reflecting lateral waves).

Processes 2000, 2100, and 2200 for forming a bulk acoustic resonator 100 (as described below with regard to FIGS. 20, 21, and 22, respectively) involve, e.g., deposition, oxidation, lithography patterning, etch, liftoff, and/or chemical mechanical planarization processes, in appropriate sequences, as described below. While these sequences of operations, and the resulting bulk acoustic resonators, are new, the techniques needed to perform each of the individual steps or operations of these processes are well understood in the art, and therefore the individual processing steps or operations are not described in detail. The dotted lines in processes 2000, 2100, and 2200 illustrate optional operations.

Figure 20:
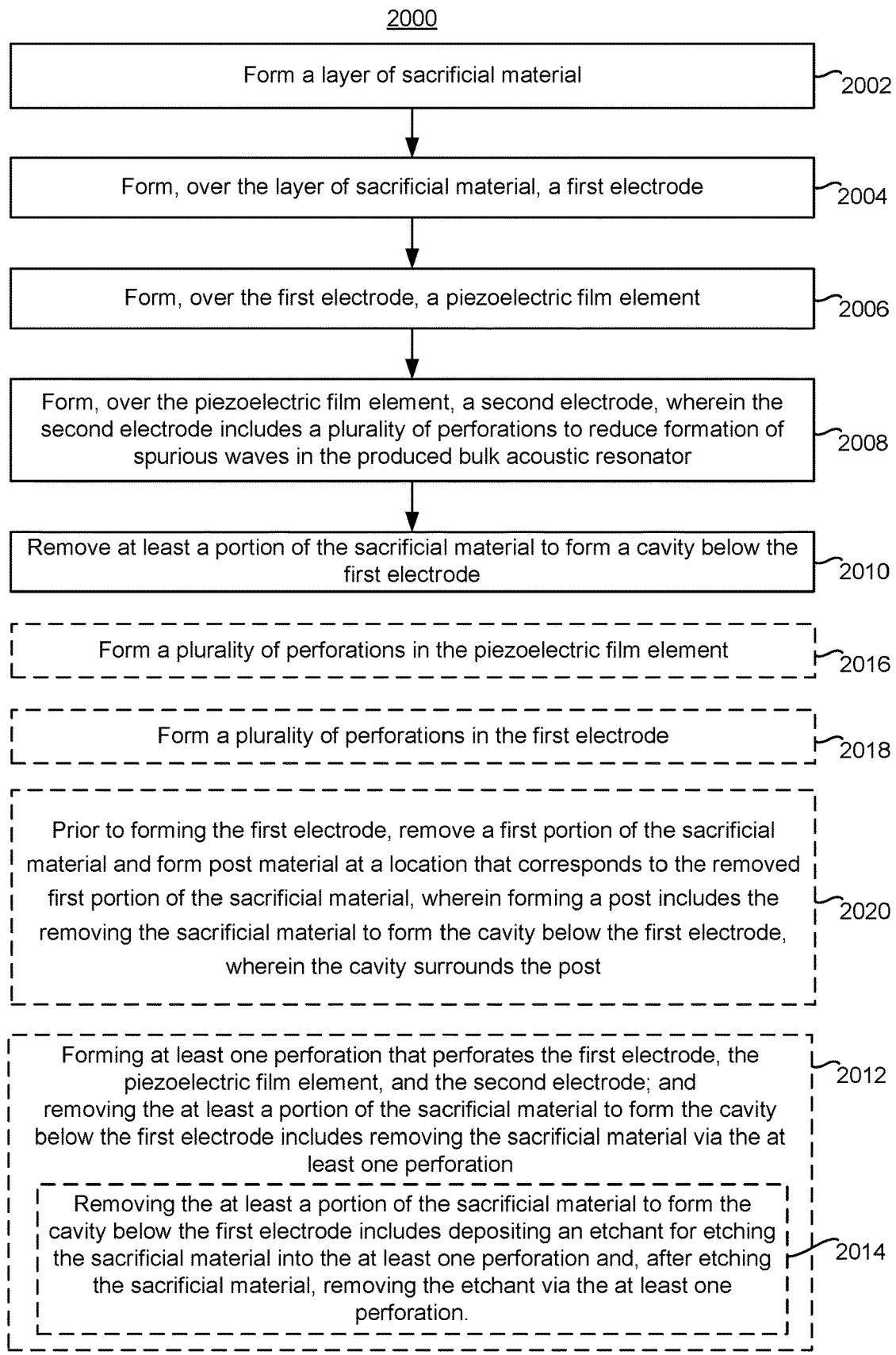
FIG. 20 illustrates a flowchart representation of a process for forming a bulk acoustic resonator that includes a plurality of perforations, in accordance with some embodiments.

FIG. 20 illustrates a flowchart representation of a process 2000 for forming a bulk acoustic resonator 100 (e.g., bulk acoustic resonator 820) that includes a plurality of perforations 118, in accordance with some embodiments. In some embodiments, a bulk acoustic resonator 100 formed in accordance with process 2000 includes one or more posts 120, as described further below.

A layer of sacrificial material (e.g., sacrificial material 804, FIG. 8A) is formed (2002). In some embodiments, the layer of sacrificial material includes silicon dioxide. In some embodiments, the layer of sacrificial material 804 is formed on a substrate (e.g., substrate 802, FIG. 8A) (e.g., silicon, glass, ceramic, gallium arsenide and/or silicon carbide), for example, as described above with regard to FIG. 8A.

A first electrode (e.g., bottom electrode 106, as shown in any of FIG. 1, 2A or 3-7, or bottom electrode layer 808, FIGS. 8D-8I) is formed (2004) over the layer of sacrificial material, for example, as described with regard to FIG. 8D. In some embodiments, the first electrode includes molybdenum, aluminum, and/or tungsten.

A piezoelectric film element (e.g., piezoelectric layer 102, as shown in any of FIG. 1, 2A or 3-7, or piezoelectric film layer 810, FIGS. 8E-8I) is formed (2006) over the first electrode, for example, as described with regard to FIG. 8E. In some embodiments, the piezoelectric film element includes, e.g., aluminum nitride and/or zinc oxide.

A second electrode (e.g., top electrode 104, as shown in any of FIG. 1, 2A or 3-7, or top electrode layer 812, FIGS. 8F-8I) is formed (2008) over the piezoelectric film element, e.g., as described with regard to FIG. 8F. In some embodiments, the second electrode includes molybdenum, aluminum, and/or tungsten. The second electrode includes a plurality of perforations (e.g., perforations 118 etched in the formed second electrode and/or formed at the time of formation of the second electrode) to reduce resonance of spurious waves in the produced bulk acoustic resonator 100. For example, perforations in the second electrode are perforations 118 as illustrated in FIG. 3, FIG. 4, FIG. 5, FIG. 7, FIG. 9A, and/or FIG. 9B. In some embodiments, the first electrode (e.g., bottom electrode 106, as shown in any of FIG. 1, 2A or 3-7) has a perimeter (e.g., perimeter 117 as indicated in FIG. 2B) and the aforementioned perforations are interior to the perimeter. In some embodiments, perforations are created in the second electrode in accordance with a pattern, such as part or all of one or more patterns described with regard to FIGS. 15-19.

At least a portion of the sacrificial material 804 is removed (2010) (e.g., by etching) to form a cavity (cavity 112, as shown in any of FIGS. 1 and 3-7) below the first electrode, for example, as described with regard to FIG. 8I.

In some embodiments, the process includes forming (2012) at least one perforation that perforates the first electrode (e.g., bottom electrode 106), the piezoelectric film element 102, and the second electrode (e.g., top electrode 104); and removing the at least a portion of the sacrificial material to form the cavity below the first electrode includes removing the sacrificial material by way of the at least one perforation. For example, the at least one perforation includes a perforation in top electrode 104 (e.g., a perforation formed using pattern 1902 as shown in FIG. 19) that is aligned or substantially aligned with perforations in piezoelectric layer 102 and bottom electrode 106.

In some embodiments, removing the at least a portion of the sacrificial material to form the cavity below the first electrode includes (2014) depositing an etchant for etching the sacrificial material into the at least one perforation and, after etching the sacrificial material, removing the etchant and etch products by way of the at least one perforation. For example, because the at least one perforation passes through a stack that includes top electrode 104, piezoelectric electric element 102, and bottom electrode 106, the at least one perforation is usable as a channel in which etchant for removing sacrificial material (e.g., sacrificial material 804a and/or 804b) flows. After etching is complete, etchant and the removed sacrificial material flows out of the bulk acoustic resonator structure by way of the channel.

In some embodiments, a plurality of perforations are formed (2014) in the piezoelectric film element (e.g., perforations 118 in piezoelectric layer 102, such as piezoelectric film layer 810). For example, perforations in the piezoelectric film element are perforations 118 as illustrated in FIG. 4, FIG. 5, FIG. 7, and/or FIG. 9B. In some embodiments, the plurality of perforations in the piezoelectric film element is formed at the time of formation of the piezoelectric film element. In some embodiments, the plurality of perforations in the piezoelectric film element is formed by etching after in the piezoelectric film element is formed and/or after the second electrode is formed. In some embodiments, perforations are created in the piezoelectric film element in accordance with and/or using a pattern, such as part or all of one or more patterns described with regard to FIGS. 15-19.

In some embodiments, a plurality of perforations are formed (2016) in the first electrode (e.g., bottom electrode 106, such as bottom electrode layer 808). For example, perforations 118 in the first electrode 106 or 808 are perforations 118 as illustrated in FIG. 3, FIG. 4, FIG. 5, FIG. 7, and/or FIG. 9B. In some embodiments, the plurality of perforations in the first electrode is formed at the time of formation of the first electrode. In some embodiments, the plurality of perforations in the first electrode is formed by etching after the first electrode is formed, after the piezoelectric film element is formed and/or after the second electrode is formed. In some embodiments, perforations are created in the first electrode accordance with and/or using a pattern, such as part or all of one or more patterns described with regard to FIGS. 15-19.

In some embodiments, the first electrode (e.g., bottom electrode 106, such as bottom electrode layer 808, FIGS. 8D-8I, or bottom electrode layer 1006, FIGS. 10B-10F) is perforated (2018) by a first set of perforations 118 (e.g., that reduce resonance of spurious waves), the piezoelectric layer (e.g., piezoelectric layer 102, such as piezoelectric film layer 810 or piezoelectric film layer 1008) is perforated by a second plurality of perforations 118 (e.g., that reduce resonance of spurious waves), and the second electrode (e.g., top electrode 104, such as top electrode layer 812 or top electrode layer 1010) is perforated by a third plurality of perforations 118 (e.g., that reduce resonance of spurious waves). For example, FIGS. 4, 5, 7, 9B, 11A, 13, and 14 illustrate examples of a bulk acoustic resonator 100 with perforations 118 that pass through the first electrode, the piezoelectric layer, and the second electrode.

In some embodiments, perforations are formed in the second electrode (e.g., top electrode 104, such as top electrode layer 812), the piezoelectric layer (e.g., piezoelectric layer 102, such as piezoelectric film layer 810) and/or the first electrode (e.g., bottom electrode 106, such as bottom electrode layer 808) to improve fabrication efficiency, for example, to enable an improved and/or more efficient etching process for formation of cavity 112 (with or without contributing to reduction of resonance of spurious waves). For example, in some embodiments, formation of cavity 112 (e.g., as described with regard to FIG. 8I) occurs after, concurrently with one or more etch processes used for formation of perforations 118. When the etchant for forming cavity 112 passes through the second electrode, the piezoelectric film layer, and the first electrode by way of perforations 118, it is not necessary to create separate etchant channels in substrate 110 to create cavity 112. In this way, sacrificial material 804 (e.g., as described with regard to FIG. 9B) is more efficiently and effectively removed to create cavity 112.

In some embodiments, prior to forming the first electrode (2020), a first portion of the sacrificial material 804 is removed (e.g., as described with regard to FIG. 8B) and post material (e.g., fill material 806, such as polysilicon, aluminum, and/or silicon dioxide) is formed at a location that corresponds to the removed first portion of the sacrificial material (e.g., as described with regard to FIG. 8C). In some embodiments, forming a plurality of posts 120 includes the removing the sacrificial material 804 to form the cavity 112 below the first electrode (e.g., as described with regard to FIG. 8I), wherein the cavity 112 surrounds the post 120.

Figure 21:
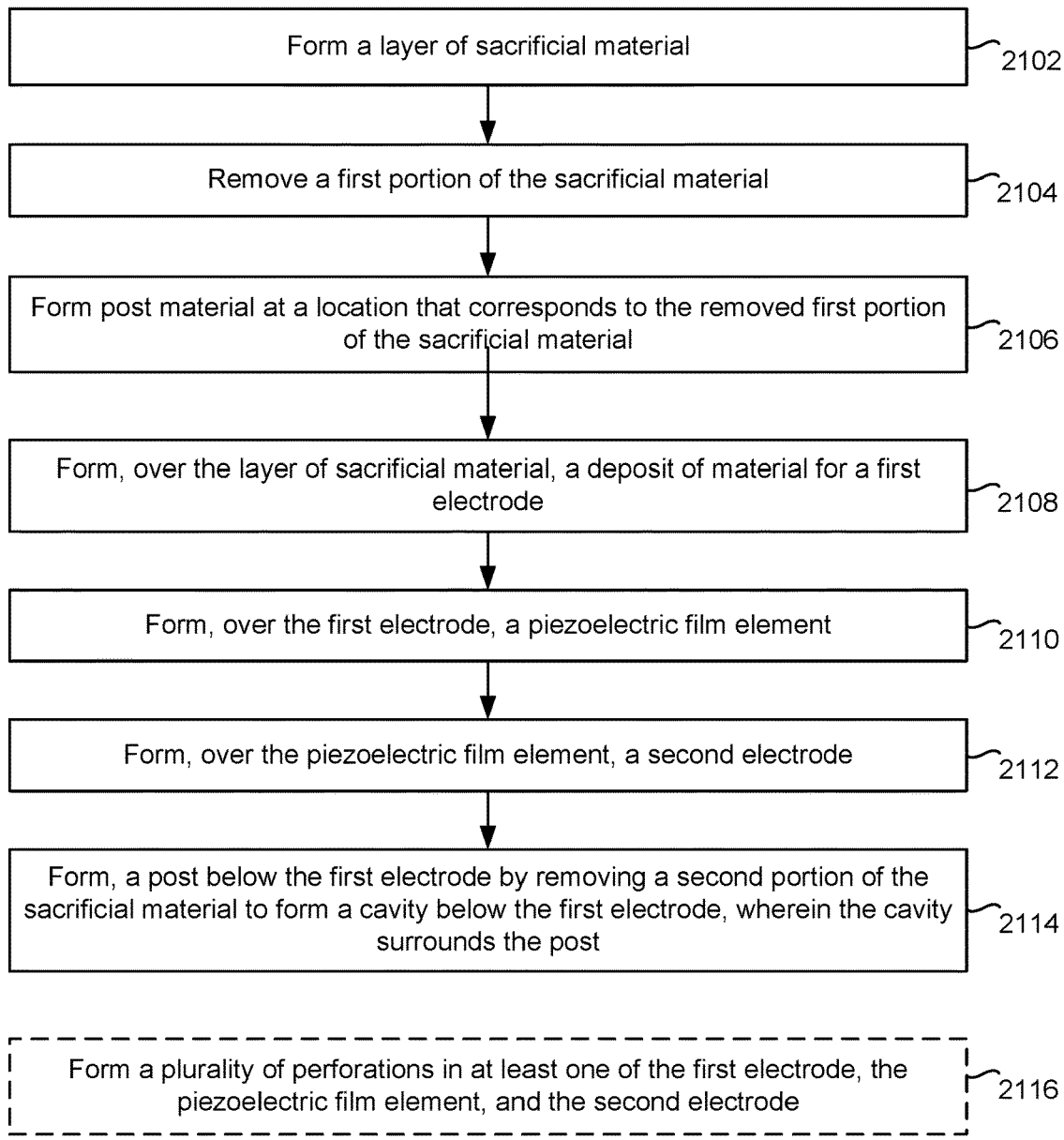
FIG. 21 illustrates a flowchart representation of a process for forming a bulk acoustic resonator that includes a plurality of posts, in accordance with some embodiments.

FIG. 21 illustrates a flowchart representation of a process 2100 for forming a bulk acoustic resonator 100 (e.g., bulk acoustic resonator 820, FIG. 8I) that includes a plurality of posts 120, in accordance with some embodiments.

A layer of sacrificial material (e.g., sacrificial material 804, FIG. 8B) is formed (2102). In some embodiments, the layer of sacrificial material includes, e.g., silicon dioxide. In some embodiments, the layer of sacrificial material 804 is formed on a substrate 802 (e.g., silicon, glass, ceramic, gallium arsenide and/or silicon carbide), e.g., as described with regard to FIG. 8A.

A first portion of the sacrificial material 804 is removed (2104), e.g., as described with regard to FIG. 8B.

Post material (e.g., fill material 806, such as polysilicon, aluminum, and/or silicon dioxide) is formed (2106) at a location that corresponds to the removed first portion of the sacrificial material (e.g., as described with regard to FIG. 8C).

A deposit of material (e.g., molybdenum, aluminum, and/or tungsten) is formed (2108) over the layer of sacrificial material 804 (e.g., as described with regard to FIG. 8D) for a first electrode (e.g., bottom electrode 106, such as bottom electrode layer 808).

A piezoelectric film element (e.g., piezoelectric layer 102, such as piezoelectric film layer 810) is formed (2110) over the first electrode, for example, as described with regard to FIG. 8E. In some embodiments, the piezoelectric film element includes aluminum nitride and/or zinc oxide.

A second electrode (e.g., top electrode 104, such as top electrode layer 812) is formed (2112) over the piezoelectric film element, for example, as described with regard to FIG. 8F. In some embodiments, the second electrode includes molybdenum, aluminum, and/or tungsten.

A post 120 is formed (2114) below the first electrode by removing (e.g., by etching) a second portion (e.g., portions 804a, 804b) of the sacrificial material 804 to form a cavity 112 below the first electrode, wherein the cavity 112 surrounds the post 120 (e.g., as described with regard to FIGS.

8H-8I). In some embodiments, a plurality of posts are created in the cavity 112 in accordance with a pattern, such as part or all of one or more patterns described with regard to FIGS. 15-18.

In some embodiments, bulk acoustic resonator includes a plurality of posts 120 and a plurality of perforations 118. For example, in some embodiments, a plurality of perforations 118 are formed (2116) in at least one of the first electrode (e.g., bottom electrode 106, such as bottom electrode layer 808), the piezoelectric film element (e.g., piezoelectric layer 102, such as piezoelectric film layer 810), and the second electrode (e.g., top electrode 104, such as top electrode layer 812). For example, FIGS. 7, 9A, 9B, and 11B illustrate bulk acoustic resonators with at least one post 120 and at least one perforation 118. In some embodiments, perforations 118 are created in the first electrode, piezoelectric film element, and/or second electrode in accordance with a pattern, such as part or all of one or more patterns described with regard to FIGS. 15-19.

Figure 22:
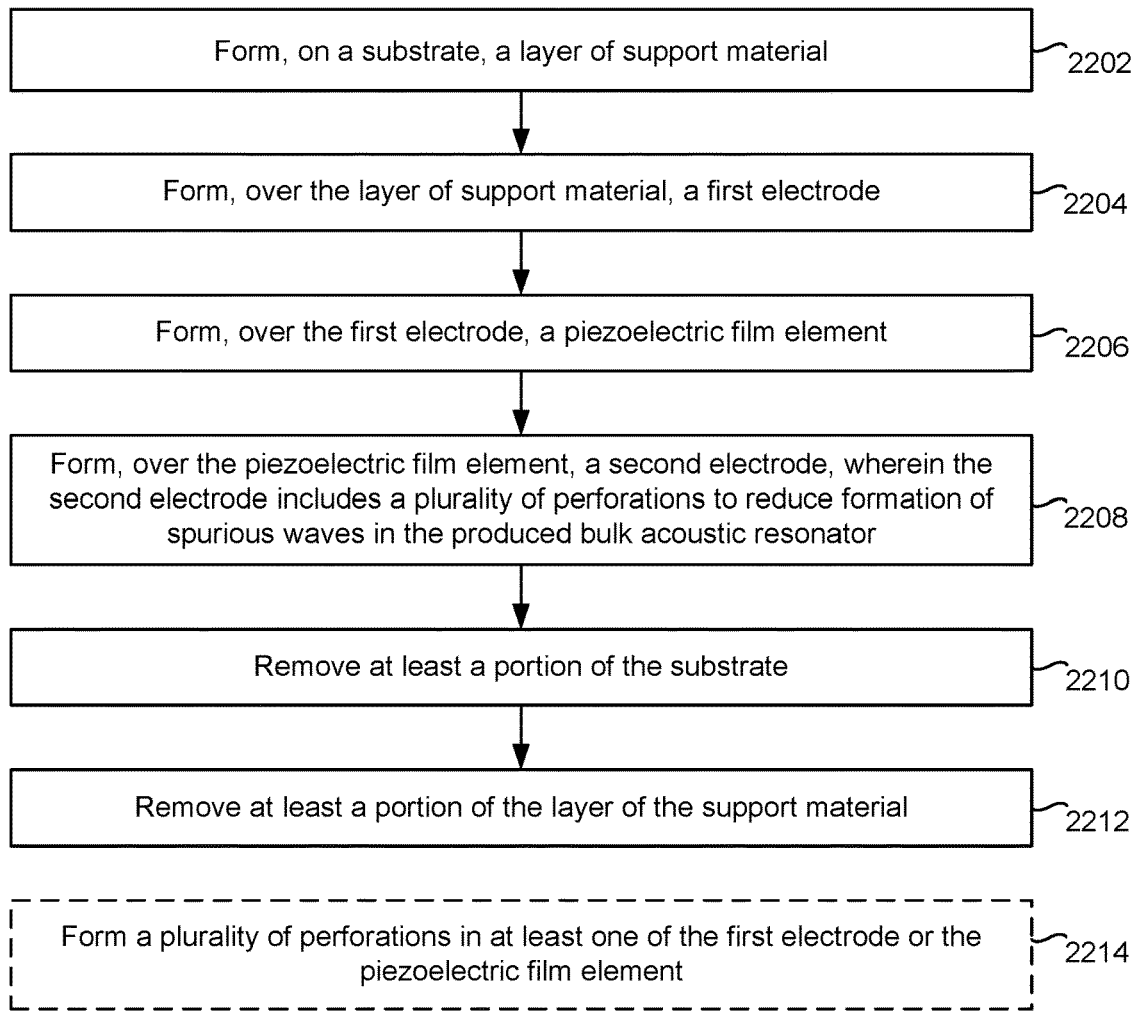
FIG. 22 illustrates a flowchart representation of a process for forming a bulk acoustic resonator by a backside etching approach, in accordance with some embodiments.

FIG. 22 illustrates a flowchart representation of a process 2200 for forming a bulk acoustic resonator 100 (e.g., bulk acoustic resonator 1020, FIG. 10F) by a backside etching approach, in accordance with some embodiments.

A layer of support material 1004 (e.g., silicon dioxide, aluminum, and/or polysilicon) is formed (2202) on a substrate 1002 (e.g., silicon, glass, ceramic, gallium arsenide and/or silicon carbide), for example, as described with regard to FIG. 10A.

A first electrode (e.g., bottom electrode 106, such as bottom electrode layer 1006) is formed (2204) over the layer of support material 1004, e.g., as described with regard to FIG. 10B. In some embodiments, the first electrode includes molybdenum, aluminum, and/or tungsten.

A piezoelectric film element (e.g., piezoelectric layer 102, such as piezoelectric film layer 1008) is formed (2206) over the first electrode, for example, as described with regard to FIG. 10C. In some embodiments, the piezoelectric film element includes, e.g., aluminum nitride and/or zinc oxide.

A second electrode (e.g., top electrode 104, such as top electrode layer 1010) is formed (2208) over the piezoelectric film element, for example, as described with regard to FIG. 8F. In some embodiments, the second electrode includes molybdenum, aluminum, and/or tungsten. The second electrode includes a plurality of perforations 118 (e.g., etched in the formed second electrode and/or formed at the time of formation of the second electrode) to reduce resonance of spurious waves in the produced bulk acoustic resonator 100. For example, perforations in the second electrode are perforations 118 as illustrated in FIG. 10D, FIG. 11B, FIG. 12, FIG. 13, and/or FIG. 14. In some embodiments, the second electrode (e.g., top electrode 104) has a perimeter (e.g., perimeter 117 as indicated in FIG. 2B) and perforations 118 are interior to the perimeter. In some embodiments, perforations are created in the second electrode in accordance with a pattern, such as part or all of one or more patterns described with regard to FIGS. 15-19.

At least a portion of the substrate 1002 is removed (2210). For example, as described with regard to FIG. 10F, at least a portion of the substrate 1002 is removed by etching to form cavity 112, leaving remaining portions 1002a and 1002b of substrate 1002 as material for supports 108. In some embodiments, at least a portion of the substrate is removed by etching to form cavity 112, leaving one or more beams as remaining portions (e.g., as described with regard to FIGS. 11A-11C).

At least a portion of the layer of the support material 1004 is removed (2212). For example, as described with regard to FIG. 10F, at least a portion of the support material 1004 is removed by etching to form cavity 112, leaving remaining portions 1004a and 1004b of support material 1004 as material for supports 108.

In some embodiments, a plurality of perforations are formed (2214) in at least one of the first electrode (e.g., bottom electrode 106, such as bottom electrode layer 1006) or the piezoelectric film element (e.g., piezoelectric layer 102, such as piezoelectric film layer 1008). For example, perforations in the piezoelectric film element are perforations 118 as illustrated in FIG. 11A, FIG. 13, and/or FIG. 14. In some embodiments, the plurality of perforations in the piezoelectric film element is formed at the time of formation of the piezoelectric film element. In some embodiments, the plurality of perforations in the piezoelectric film element is formed by etching after in the piezoelectric film element is formed and/or after the second electrode is formed. In some embodiments, the plurality of perforations in the first electrode is formed at the time of formation of the first electrode. In some embodiments, the plurality of perforations in the first electrode is formed by etching after the first electrode is formed, after the piezoelectric film element is formed and/or after the second electrode is formed. In some embodiments, perforations are created in the piezoelectric film element and/or the first electrode in accordance with and/or using a pattern, such as part or all of one or more patterns described with regard to FIGS. 15-19.

Various aspects of bulk acoustic resonators and processes for forming bulk acoustic resonators are described with regard to the embodiments below.

In some embodiments, a first perforation of a plurality of perforations in a first layer (e.g., perforations 118 in piezoelectric layer 102) has a first perforation characteristic (e.g., shape, size, and/or orientation) and a second perforation of a plurality of perforations in the first layer has a second perforation characteristic that is distinct from the first perforation characteristic. For example, as indicated in pattern 1502 of FIG. 15, a perforation at a location indicated by 1504 has a first area and a perforation at a location indicated by 1506 has a second area that is smaller than the first area. As indicated in pattern 1702 of FIG. 17, a perforation at a location indicated by 1704a has a first orientation (e.g., a vertical orientation) and a perforation at a location indicated by 1704b has a second orientation (e.g., a horizontal orientation) that is different from the first orientation. As indicated in pattern 1802 of FIG. 18, a perforation at a location indicated by 1806 has a first shape (e.g., a trapezoid) and a perforation at a location indicated by 1804 has a second shape (e.g., an oblong rectangle).

In some embodiments, at least a part of a first perforation of the first plurality of perforations is asymmetrical with respect to at least one other part of the first perforation (e.g., one perforation of the first plurality of perforations has at least one set of non-parallel opposite edges). For example, one side of a perforation is angled and another side of the perforation is not angled (e.g., as indicated in pattern 1802 of FIG. 18, a perforation at a location indicated by 1806 has an angled side 1812 and a non-angled side 1814). In some embodiments, at least one perforation of the first plurality of perforations has a polygonal shape with more than four sides (e.g., an L-shaped hole).

In some embodiments, a distribution of a set of perforations (e.g., all of the perforations or less than all of the perforations) satisfies predefined non-uniformity and/or randomness criteria. For example, the shapes, sizes and/or positions of a set of perforations 118 are determined in accordance with a pseudorandom function or generator. In some embodiments, a random or non-uniform distribution of perforations is used to reduce resonance of spurious waves.

In some embodiments, a first subset of perforations is asymmetric with respect to a second subset of perforations (e.g., asymmetric with respect to a centerline that divides the resonating area of the piezoelectric layer into equal halves). For example, as indicated in pattern 1802 of FIG. 18, a number of features 1804 to the right of centerline 1808 is greater than the number of features 1804 to the left of centerline 1808, and locations of features 1804 and 1806 above centerline 1810 do not correspond to locations of features 1804 and 1806 below centerline 1810. In pattern 1702 of FIG. 17, a first plurality of perforations 1704a aligned along a first diagonal have a first orientation (e.g., a vertical orientation) and a second plurality of perforations 1704b aligned along a second diagonal have a second orientation (e.g., a horizontal orientation) that is different from the first orientation.

In some embodiments, a first electrode (e.g., bottom electrode 106, such as bottom electrode layer 808 or bottom electrode layer 1006) and/or a second electrode (e.g., top electrode 104, such as top electrode layer 812 or top electrode layer 1010) has at least one irregularly indented edge. In some embodiments, the irregular indentations include, e.g., multiple non-periodic notches and/or a "ragged" edge (e.g., random, pseudorandom, or otherwise non-uniform distance from the centerline of the electrode to at least one edge). In some embodiments, a non-uniform electrode edge is used to reduce resonance of spurious waves.

In some embodiments, a first subset of the first plurality of perforations has a first density and a second subset of the first plurality of perforations has a second density that is different from the first density. For example, as shown in FIG. 16, the distribution of features that are closest to the edge of pattern 1602 (e.g., the features that are closest to the perimeter of the pattern) are denser than the distribution of features that are closer to the center of pattern 1602.

In some embodiments, a first subset of the first plurality of perforations has a first distance from a first edge of the second electrode and a second subset of the first plurality of perforations has a second distance from the first edge of the second electrode that is different from the first distance. For example, as shown in FIG. 17, feature 1714 is further from the left edge of pattern 1702 than feature 1706.

In some embodiments, at least one perforation of the first plurality of perforations has an edge that is not parallel to any edge of the second electrode. For example, as shown in FIG. 18, features 1824, 1822, and 1820 have no edges that are parallel to the edges of pattern 1802.

In some embodiments, a first plurality of perforations in a first layer (e.g., in piezoelectric layer 102) have a first distribution of perforations and a second plurality of perforations in a second layer (e.g., in bottom electrode 106) and/or a third plurality of perforations in a third layer (e.g., in top electrode 104) have a second distribution of perforations that is distinct from the first distribution of perforations. For example, as indicated in pattern 1602 of FIG. 16, a first plurality of perforations at locations indicated by features 1608 (e.g., perforations in top electrode 104 and/or bottom electrode 106) have a first distribution (e.g., toward the center of the pattern 1602) and a second plurality of perforations at locations indicated by features 1604 (e.g., perforations 118 that pass through piezoelectric layer 102 and that also pass through top electrode 104 and/or bottom electrode 106) have a second distribution (e.g., toward the edge of pattern 1602). As indicated in pattern 1802 of FIG. 18, a first plurality of perforations at locations indicated by features 1806 (e.g., perforations in top electrode 104 and/or bottom electrode 106) have a first distribution and a second plurality of perforations at locations indicated by features 1804 (e.g., perforations that pass through piezoelectric layer 102 and that also pass through top electrode 104 and/or bottom electrode 106) have a second distribution that is different from the first distribution. FIGS. 5 and 14 provide examples in which distributions of perforations 118 in piezoelectric layer 102 are distinct from distributions of perforations 118 in top electrode 104 and bottom electrode 106.

In some embodiments, a first plurality of perforations in a first layer (e.g., in piezoelectric layer 102) have a first distribution of perforations, and at least a subset of a second plurality of perforations in a second layer (e.g., in bottom electrode 106) and/or at least a subset of a third plurality of perforations in a third layer (e.g., in top electrode 104) have a second distribution of perforations that is aligned with at least a subset of the first distribution of perforations. In some embodiments, perforations that correspond to features 1608 of FIG. 16 pass through top electrode 104 and/or bottom electrode 106, but do not pass through piezoelectric layer 102, and perforations that correspond to features 1604 of FIG. 16 pass through piezoelectric layer 102 and also pass through top electrode 104 and/or bottom electrode 106. For example, the larger perforations that correspond to features 1604 are aligned through multiple layers to aid in etching while the smaller perforations that correspond to features 1608 are not aligned. In some embodiments, perforations that correspond to features 1504, 1604, 1704, and/or 1804 (shown in FIGS. 15, 16, 17, and 18, respectively) pass through piezoelectric layer 102 and also pass through top electrode 104 and/or bottom electrode 106. FIGS. 4, 7, 9B, 11A and 13 provide examples in which distributions of perforations in piezoelectric layer 102 are aligned with distributions of perforations 118 in top electrode 104 and bottom electrode 106, in accordance with some embodiments.

In some embodiments, at least one perforation of a first plurality of perforations in a first layer (e.g., in piezoelectric layer 102) has a first perforation characteristic (e.g., shape, size, and/or orientation), and at least one perforation of a second plurality of perforations in a second layer (e.g., in bottom electrode 106) and/or a third plurality of perforations in a third layer (e.g., in top electrode 104) has a second perforation characteristic that is distinct from the first perforation characteristic. For example, as indicated in pattern 1602 of FIG. 16, a perforation at a location indicated by feature 1604 (e.g., that passes through piezoelectric layer 102 and that also passes through top electrode 104 and/or bottom electrode 106) has a first area and a perforation at a location indicated by feature 1608 (e.g., that passes through top electrode 104 and/or bottom electrode 106) has a second area that is smaller than the first area. In FIG. 18, a perforation at a location indicated by feature 1804 (e.g., that passes through piezoelectric layer 102 and that also passes through top electrode 104 and/or bottom electrode 106) has a first shape (e.g., rectangular) and orientation (e.g., vertical) and a perforation at a location indicated by feature 1806 (e.g., that passes through top electrode 104 and/or bottom electrode 106) has a second shape (e.g., trapezoidal) that is different from the first shape and a second orientation (e.g., diagonal) that is different from the first orientation.

In some embodiments, a first post 120 of a plurality of posts has a first footprint (e.g., shape, size, and/or orientation) and a second post 120 of the plurality of posts has a second footprint that is distinct from the first footprint. For example, a post at a location indicated by feature 1606*a* of pattern 1602 in FIG. 16 has a first footprint area and a post at a location indicated by feature 1606*b* has a second footprint area that is smaller than the first footprint area.

In some embodiments, at least a part of a post 120 is asymmetrical with respect to at least one other part of the first post. For example, one side of a post 120 is angled and another side of the post is not angled. In some embodiments, at least one post 120 has a polygonal footprint with more than four sides (e.g., an L-shaped footprint). In some embodiments, at least one post 120 has at least one set of non-parallel opposite edges.

In some embodiments, a distribution of a set of posts 120 (e.g., all of the posts or less than all of the posts) satisfies predefined non-uniformity and/or randomness criteria.

In some embodiments, a first subset of a plurality of posts 120 is asymmetric with respect to a second subset of the plurality of posts (e.g., asymmetric with respect to a centerline that divides the resonating area of the piezoelectric layer into equal halves).

In some embodiments, a distribution of a plurality of posts 120 is distinct from a distribution of a plurality of perforations 118, such as a first plurality of perforations 118 in a first layer (e.g., in piezoelectric layer 102), a second plurality of perforations 118 in a second layer (e.g., in bottom electrode 106) and/or a third plurality of perforations 118 in a third layer (e.g., in top electrode 104). For example, a distribution of posts 120 at locations indicated by features 1606 (e.g., 1606*a*, 1606*b*) of pattern 1602 in FIG. 16 have a different distribution from: a distribution of perforations at locations indicated by features 1604 (e.g., that pass through piezoelectric layer 102 and that also pass through top electrode 104 and/or bottom electrode 106); and a distribution of perforations at locations indicated by features 1608 (e.g., that pass through top electrode 104 and/or bottom electrode 106).

In some embodiments, at least one post 120 has a post footprint characteristic (e.g., shape, size, and/or orientation) that is distinct from a perforation characteristic of at least one perforation of the first plurality of perforations. For example, a footprint of a post 120 at a location of pattern 1602 indicated by feature 1606*b* has a footprint area that is smaller than a footprint area of a perforation 118 at a location indicated by feature 1604 and larger than a footprint area of a perforation 118 at a location indicated by feature 1608.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising: a stack that includes: a first electrode coupled to a first side of a piezoelectric layer; and a second electrode coupled to a second side of the piezoelectric layer; wherein the stack is configured to resonate in response to an electrical signal applied between the first electrode and the second electrode; and wherein the second electrode is perforated by a first plurality of perforations that reduce resonance of spurious waves, wherein a distribution of a set of perforations in the first plurality of perforations satisfies predefined non-uniformity and/or randomness criteria.

2. The bulk acoustic resonator of claim 1, wherein a first subset of the first plurality of perforations is asymmetric with respect to a second subset of the first plurality of perforations.

3. The bulk acoustic resonator of claim 2, wherein the first subset of the first plurality of perforations has a first density and the second subset of the first plurality of perforations has a second density that is different from the first density.

4. The bulk acoustic resonator of claim 2, wherein the first subset of the first plurality of perforations has a first distance from a first edge of the second electrode and the second subset of the first plurality of perforations has a second distance from the first edge of the second electrode that is different from the first distance.

5. The bulk acoustic resonator of claim 1, wherein the first electrode and/or the second electrode has at least one irregularly indented edge.

6. The bulk acoustic resonator of claim 1, wherein:
the piezoelectric layer is perforated by a second plurality of perforations, and
the first electrode is perforated by a third plurality of perforations.

7. The bulk acoustic resonator of claim 6, wherein:
the first plurality of perforations have a first distribution of perforations, and
the second plurality of perforations and/or the third plurality of perforations have a second distribution of perforations that is distinct from the first distribution of perforations.

8. The bulk acoustic resonator of claim 6, wherein:
the first plurality of perforations have a first distribution of perforations, and at least a subset of the second plurality of perforations and/or at least a subset of the third plurality of perforations have a second distribution of perforations that is aligned with at least a subset of the first distribution of perforations.

9. The bulk acoustic resonator of claim 1, wherein a cavity below the first electrode includes a plurality of posts that are coupled to the first electrode, wherein the plurality of posts reduce resonance of spurious waves.

10. The bulk acoustic resonator of claim 9, wherein a first post of the plurality of posts has a first footprint and a second post of the plurality of posts has a second footprint that is distinct from the first footprint.

11. A bulk acoustic resonator, comprising: a stack that includes: a first electrode coupled to a first side of a piezoelectric layer; and a second electrode coupled to a second side of the piezoelectric layer; wherein the stack is configured to resonate in response to an electrical signal applied between the first electrode and the second electrode; and wherein a cavity below the first electrode includes a plurality of posts that are coupled to the first electrode, wherein the plurality of posts reduce resonance of spurious waves, wherein a distribution of a set of posts in the plurality of posts satisfies predefined non-uniformity and/or randomness criteria.

12. The bulk acoustic resonator of claim 11, wherein a first post of the plurality of posts has a first footprint and a second post of the plurality of posts has a second footprint that is distinct from the first footprint.

13. The bulk acoustic resonator of claim 11, wherein a first subset of the plurality of posts is asymmetric with respect to a second subset of the plurality of posts.

14. The bulk acoustic resonator of claim 11, wherein the first electrode and/or the second electrode has at least one irregularly indented edge.

15. The bulk acoustic resonator of claim 11, wherein the second electrode is perforated by a first plurality of perforations that reduce resonance of spurious waves.

16. The bulk acoustic resonator of claim 15, wherein a distribution of the plurality of posts is distinct from a distribution of the first plurality of perforations.

17. The bulk acoustic resonator of claim 15, wherein:
the piezoelectric layer is perforated by a second plurality of perforations, and
the first electrode is perforated by a third plurality of perforations.

18. A bulk acoustic resonator prepared by a process comprising the steps of: forming a layer of sacrificial material; forming, over the layer of sacrificial material, a first electrode; forming, over the first electrode, a piezoelectric film element, forming, over the piezoelectric film element, a second electrode, wherein the second electrode includes a first plurality of perforations to reduce resonance of spurious waves in the bulk acoustic resonator, wherein a distribution of a set of perforations in the first plurality of perforations satisfies predefined non-uniformity and or randomness criteria; and removing at least a portion of the sacrificial material to form a cavity below the first electrode.

19. The bulk acoustic resonator of claim 18, wherein the process includes forming a second plurality of perforations in the piezoelectric film element.

20. The bulk acoustic resonator of claim 19, wherein the process includes forming a third plurality of perforations in the first electrode.

21. The bulk acoustic resonator of claim 18, wherein the process includes, prior to forming the first electrode: removing a first portion of the sacrificial material; and forming post material at a location that corresponds to the removed first portion of the sacrificial material; and wherein forming a plurality of posts includes the removing the sacrificial material to form the cavity below the first electrode, wherein the cavity surrounds respective posts of the plurality of posts.

22. The bulk acoustic resonator of claim 18, wherein the process includes forming at least one perforation that perforates the first electrode, the piezoelectric film element, and the second electrode; and removing the at least a portion of the sacrificial material to form the cavity below the first electrode, includes removing the sacrificial material by way of the at least one perforation.

23. The bulk acoustic resonator of claim 22, wherein removing the at least a portion of the sacrificial material to form the cavity below the first electrode includes depositing an etchant for etching the sacrificial material into the at least one perforation and, after etching the sacrificial material, removing the etchant and etch products by way of the at least one perforation.

* * * * *